(12) United States Patent  
Amin et al.

(10) Patent No.: US 10,914,867 B2
(45) Date of Patent: Feb. 9, 2021

(54) HARDCOATED GLASS-CERAMIC ARTICLES

(71) Applicant: CORNING INCORPORATED, Corning, NY (US)

(72) Inventors: Jaymin Amin, Corning, NY (US); Shandon Dee Hart, Corning, NY (US); Timothy James Kiczenski, Corning, NY (US); Karl William Koch, III, Elmira, NY (US); Carlo Anthony Kosik Williams, Painted Post, NY (US); Alexandre Michel Mayolet, Corning, NY (US); Charles Andrew Paulson, Painted Post, NY (US); James Joseph Price, Corning, NY (US)

(73) Assignee: Corning Incorporated, Corning, NY (US)

( * ) Notice: Subject to any disclaimer, the term of this patent is extended or adjusted under 35 U.S.C. 154(b) by 282 days.

(21) Appl. No.: 15/927,619

(22) Filed: Mar. 21, 2018

(65) Prior Publication Data
US 2018/0275318 A1 Sep. 27, 2018

Related U.S. Application Data

(60) Provisional application No. 62/474,393, filed on Mar. 21, 2017.

(51) Int. Cl.
*G02B 1/14* (2015.01)
*G02B 1/02* (2006.01)
(Continued)

(52) U.S. Cl.
CPC .............. *G02B 1/14* (2015.01); *C03C 10/00* (2013.01); *C03C 17/3435* (2013.01); *G02B 1/02* (2013.01);
(Continued)

(58) Field of Classification Search
None
See application file for complete search history.

(56) References Cited

U.S. PATENT DOCUMENTS 8,312,739 B2 11/2012 Lee et al.
8,561,429 B2 10/2013 Allan et al.
(Continued)

FOREIGN PATENT DOCUMENTS

JP 2018010275 A 1/2018

OTHER PUBLICATIONS

Fischer-Cripps; "Critical Review of Analysis and Interpretation of Nanoindentation Test Data"; Surface & Coatings Technology, 200 (2006) pp. 4153-4165.
(Continued)

*Primary Examiner* — Derek S. Chapel

(57) ABSTRACT

According to one embodiment, there is an article including a glass-ceramic substrate having a major surface, an optical coating is disposed on the major surface and forms an appearance-enhancing surface, the optical coating including a appearance-enhancing coating, and a scratch-resistant layer. The article exhibits a hardness of 8 GPa or more, and a photopic average diffuse light reflectance measured at the appearance-enhancing surface of one of: (i) about 0.3% or less; (ii) about 0.2% or less; (iii) about 0.1% or less, over an optical wavelength regime in the range from about 400 nm to about 800 nm. Further, in the (L*, a*, b*) colorimetry system of the International Commission on Illumination, at near-normal incidence, the article comprises a diffuse reflectance dE* of one of: (i) about 3 or less; (ii) about 2 or less; or (iii) about 1 or less, where dE* is defined as dE*=sqrt(L*²+a*²+b*²).

18 Claims, 16 Drawing Sheets

(51) Int. Cl.

| | | |
|---|---|---|
| *C03C 17/34* | (2006.01) | |
| *C03C 10/00* | (2006.01) | |
| *G02B 5/28* | (2006.01) | |
| *H05K 5/03* | (2006.01) | |
| *H05K 5/00* | (2006.01) | |
| *G02B 1/18* | (2015.01) | |
| *G02B 27/00* | (2006.01) | |

(52) U.S. Cl.
CPC ............... *G02B 1/18* (2015.01); *G02B 5/28* (2013.01); *G02B 27/0006* (2013.01); *C03C 2217/734* (2013.01); *C03C 2217/76* (2013.01); *C03C 2217/78* (2013.01); *H05K 5/0017* (2013.01); *H05K 5/03* (2013.01)

(56) References Cited

U.S. PATENT DOCUMENTS

| | | |
|---|---|---|
| 8,974,896 B2 | 3/2015 | Peterson et al. |
| 9,079,802 B2 | 7/2015 | Bellman et al. |
| 9,115,023 B2 | 8/2015 | Beall et al. |
| 9,133,054 B2 | 9/2015 | Beall et al. |
| 9,321,672 B2 | 4/2016 | Shiratori et al. |
| 9,335,444 B2 | 5/2016 | Hart et al. |
| 9,359,261 B2 | 6/2016 | Bellman et al. |
| 9,366,784 B2 | 6/2016 | Bellman et al. |
| 9,403,716 B2 | 8/2016 | Dejneka et al. |
| 9,703,011 B2 | 7/2017 | Adib et al. |
| 10,401,539 B2 * | 9/2019 | Bellman ............. C03C 17/3452 |
| 2014/0049822 A1 * | 2/2014 | Gollier .................. G02B 5/021 |
| | | 359/488.01 |
| 2014/0113083 A1 | 4/2014 | Lee et al. |
| 2014/0334006 A1 | 11/2014 | Adib et al. |
| 2014/0335330 A1 | 11/2014 | Bellman et al. |
| 2015/0239772 A1 | 8/2015 | Baker et al. |
| 2015/0322270 A1 | 11/2015 | Amin et al. |
| 2015/0323705 A1 | 11/2015 | Hart et al. |
| 2016/0238743 A1 | 8/2016 | Bellman et al. |
| 2017/0075039 A1 | 3/2017 | Hart et al. |

OTHER PUBLICATIONS

Hay et al; "Continuous Stiffness Measurement During Instrumented Indentation Testing"; Experimental Techniques, 34 (3) 86-94 (2010).
Wang et al; "Toward Hard Yet Tough Ceramic Coatings"; Surface & Coatings Technology; 258 (2014) pp. 1-6.
International Search Report and Written Opinion PCT/US2018/022619 dated Jun. 29, 2018.

\* cited by examiner

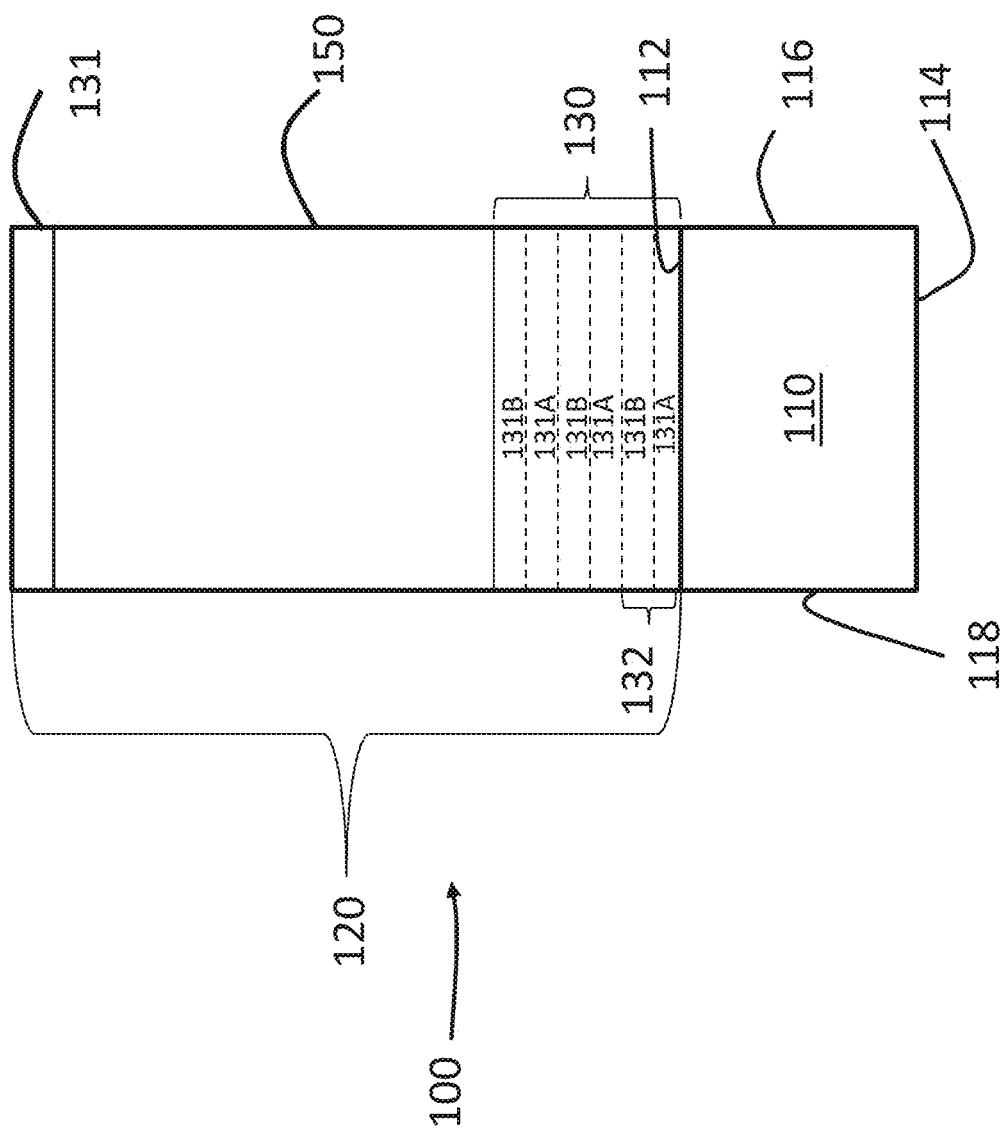

HARDCOATED GLASS-CERAMIC ARTICLES

CROSS-REFERENCE TO RELATED APPLICATION

This application claims the benefit of priority under 35 U.S.C. § 119 of U.S. Provisional Application Ser. No. 62/474,393 filed on Mar. 21, 2017, the content of which is relied upon and incorporated herein by reference in its entirety.

BACKGROUND

The disclosure relates to advantaged combinations of optical hardcoatings with opaque, translucent, and colored glass-ceramic substrates. These optical hardcoatings impart high hardness, high scratch resistance, and desirable optical appearance attributes (including deep, rich, or otherwise aesthetically pleasing visual attributes) to the combined article.

Articles (including front and/or back covers, and/or other, housing portions) are often used to protect critical devices within electronic products, to provide a user interface for input and/or display, and/or many other functions. Such products include mobile devices, such as smart phones, mp3 players and computer tablets. Cover articles also include architectural articles, transportation articles (e.g., articles used in automotive applications, trains, aircraft, sea craft, etc.), appliance articles, or any article that benefit from some opacity, translucency, or color, scratch-resistance, abrasion resistance or a combination thereof. These applications often demand scratch-resistance and strong optical performance characteristics.

The optical performance of cover articles can be improved by using various appearance-enhancing coatings; however known appearance-enhancing coatings are susceptible to wear or abrasion. Such abrasion can compromise any optical performance improvements achieved by the appearance-enhancing coating. For example, optical filters are often made from multilayer coatings having differing refractive indices and made from optically transparent dielectric material (e.g., oxides, nitrides, and fluorides). Most of the typical oxides used for such optical filters are wide band-gap materials, which do not have the requisite mechanical properties, such as hardness, for use in mobile devices, architectural articles, transportation articles or appliance articles.

Abrasion damage can include reciprocating sliding contact from counter face objects (e.g., fingers). In addition, abrasion damage can generate heat, which can degrade chemical bonds in the film materials and cause flaking and other types of damage to the cover glass. Since abrasion damage is often experienced over a longer term than the single events that cause scratches, the coating materials disposed experiencing abrasion damage can also oxidize, which further degrades the durability of the coating.

Known appearance-enhancing coatings are also susceptible to scratch damage and, often, even more susceptible to scratch damage than the underlying substrates on which such coatings are disposed. In some instances, a significant portion of such scratch damage includes microductile scratches, which typically include a single groove in a material having extended length and with depths in the range from about 100 nm to about 500 nm. Microductile scratches may be accompanied by other types of visible damage, such as sub-surface cracking, frictive cracking, chipping and/or wear. Evidence suggests that a majority of such scratches and other visible damage is caused by sharp contact that occurs in a single contact event. Once a significant scratch appears on the cover substrate, the appearance of the article is degraded since the scratch causes an increase in light scattering, which may cause significant reduction in brightness, clarity and contrast of images on the display. Significant scratches can also affect the accuracy and reliability of articles including touch sensitive displays. Single event scratch damage can be contrasted with abrasion damage. Single event scratch damage is not caused by multiple contact events, such as reciprocating sliding contact from hard counter face objects (e.g., sand, gravel and sandpaper), nor does it typically generate heat, which can degrade chemical bonds in the film materials and cause flaking and other types of damage. In addition, single event scratching typically does not cause oxidization or involve the same conditions that cause abrasion damage and therefore, the solutions often utilized to prevent abrasion damage may not also prevent scratches. Moreover, known scratch and abrasion damage solutions often compromise the optical properties.

Accordingly, there is a need for new cover articles, and methods for their manufacture, which are abrasion resistant, scratch resistant and have improved optical performance.

SUMMARY

Embodiments of durable and scratch resistant articles having appearance-enhancing coatings are described. In one or more embodiments, the article includes a substrate and an optical coating disposed on the major surface of the substrate forming an appearance-enhancing surface. In one or more embodiments, the optical coating includes an appearance-enhancing coating. Opaque, translucent, and colored glass-ceramics have been developed, for example those described in U.S. Pat. No. 9,115,023, "Colored and opaque glass-ceramic(s), associated colorable and ceramable glass(es), and associated process(es)", U.S. Pat. No. 9,403,716 "Glass-ceramic(s); associated formable and/or color-tunable, crystallizable glass(es); and associated process(es)", and US published patent application 20150239772, "Low Crystallinity Glass-Ceramics".

The article exhibits scratch resistance by exhibiting a maximum hardness of about 8 GPa or greater, for example, 10 GPa or greater, 12 GPa or greater, 14 GPa or greater, or 16 GPa or greater, as measured by a Berkovich Indenter Hardness Test, as described herein, along an indentation depth of about 50 nm or greater (e.g., about 100 nm or greater, from about 50 nm to about 300 nm, from about 50 nm to about 400 nm, from about 50 nm to about 500 nm, from about 50 nm to about 600 nm, from about 50 nm to about 1000 nm or from about 50 nm to about 2000 nm), on the appearance-enhancing surface.

The article exhibits an abrasion resistance as measured on the appearance-enhancing surface after a 500-cycle abrasion using a Taber Test, as described herein. In one or more embodiments, the article exhibits an abrasion resistance (as measured on the appearance-enhancing surface), wherein after abrasion the appearance-enhancing surface exhibits an average roughness Ra, as measured by atomic force microscopy, of about 12 nm or less.

In one or more embodiments, the appearance-enhancing coating may include a plurality of layers. For example, in some embodiments, the appearance-enhancing coating includes a period comprising a first low refractive index (RI) layer and a second high RI layer. The period may include a first low RI layer and a second high RI disposed on the first low RI layer or vice versa. In some embodiments, the period may include a third layer. The appearance-enhancing coating may include a plurality of periods such that the first low RI layer and the second high RI layer alternate. The appearance-enhancing coating can include up to about 10 or 20 periods.

In some embodiments, the optical coating includes a scratch resistant layer. Where scratch resistant layers are included, such layers may be disposed on the appearance-enhancing coating. In other embodiments, the scratch resistant coating is disposed between the appearance-enhancing coating and the substrate. Exemplary scratch resistant layers may exhibit a maximum hardness in the range from about 8 GPa to about 50 GPa as measured by a "Berkovich Indenter Hardness Test", as defined here. More specifically, hardness and modulus values of thin film coatings as reported herein were determined using widely accepted nanoindentation practices. See: Fischer-Cripps, A. C., Critical Review of Analysis and Interpretation of Nanoindentation Test Data, Surface & Coatings Technology, 200, 4153-4165 (2006) (hereinafter "Fischer-Cripps"); and Hay, J., Agee, P, and Herbert, E., Continuous Stiffness measurement During Instrumented Indentation Testing, Experimental Techniques, 34 (3) 86-94 (2010) (hereinafter "Hay"). For coatings, it is typical to measure hardness and modulus as a function of indentation depth. So long as the coating is of sufficient thickness, it is then possible to isolate the properties of the coating from the resulting response profiles. It should be recognized that if the coatings are too thin (for example, less than ~500 nm), it may not be possible to completely isolate the coating properties as they can be influenced from the proximity of the substrate which may have different mechanical properties. See Hay. The methods used to report the properties herein are representative of the coatings themselves. The process is to measure hardness and modulus versus indentation depth out to depths approaching 1000 nm. In the case of hard coatings on a softer glass, the response curves will reveal maximum levels of hardness and modulus at relatively small indentation depths (less than or equal to about 200 nm). At deeper indentation depths both hardness and modulus will gradual diminish as the response is influenced by the softer glass substrate. In this case the coating hardness and modulus are taken be those associated with the regions exhibiting the maximum hardness and modulus. In the case of soft coatings on a harder glass substrate, the coating properties will be indicated by lowest hardness and modulus levels that occur at relatively small indentation depths. At deeper indentation depths, the hardness and modulus will gradually increase due to the influence of the harder glass. These profiles of hardness and modulus versus depth can be obtained using either the traditional Oliver and Pharr approach (as described in Fischer-Cripps) or by the more efficient continuous stiffness approach (see Hay). Extraction of reliable nanoindentation data requires that well-established protocols be followed. Otherwise, these metrics can be subject to significant errors. The elastic modulus and hardness values reported herein for such thin films were measured using known diamond nanoindentation methods, as described above, with a Berkovich diamond indenter tip. As used herein, hardness refers to a maximum (or minimum) hardness, and not an average hardness.

The scratch resistant layer may be disposed between the substrate and the appearance-enhancing coating. In some embodiments, the appearance-enhancing coating may include a first portion and a second portion such that the scratch resistant layer is disposed between the first portion and the second portion. The thickness of the scratch-resistant layer may be in the range from about 200 nanometers to about 3 micrometers.

In some embodiments, the article may include a layer having a refractive index greater than about 1.8. Materials that may be utilized in that layer include $SiN_x$, $SiO_xN_y$, $Si_uAl_vO_xN_y$, $AlN_x$, $AlO_xN_y$, or a combination thereof.

In some instances, the article may include an additional layer, such as an easy-to-clean coating, a diamond-like carbon ("DLC") coating, a scratch-resistant coating or a combination thereof. Such coatings may be disposed on the appearance-enhancing coating or between layers of the appearance-enhancing coating.

The substrate utilized in one or more embodiments of the article can include glass-ceramic, ceramic, or combinations thereof. In some embodiments, the substrate may be strengthened and may include a compressive stress (CS) layer with a surface CS of at least 250 MPa extending within the strengthened substrate from a surface of the chemically strengthened glass to a depth of layer (DOL) of at least about 10 μm.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 16 is an illustration of an article according to one or more embodiments.

DETAILED DESCRIPTION

Reference will now be made in detail to various embodiments, examples of which are illustrated in the accompanying drawings.

Figure 1:
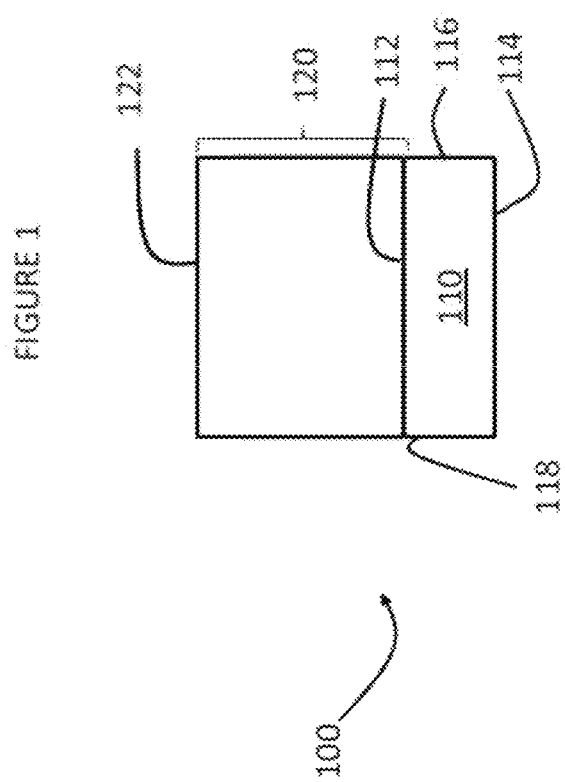
FIG. 1 is a side view of an article, according to one or more embodiments.

Referring to FIG. 1, the article 100 according to one or more embodiments may include a substrate 110, and an optical coating 120 disposed on the substrate. The substrate 110 includes opposing major surfaces 112, 114 and opposing minor surfaces 116, 118. The optical coating 120 is shown in FIG. 1 as being disposed on a first opposing major surface 112; however, the optical coating 120 may be disposed on the second opposing major surface 114 and/or one or both of the opposing minor surfaces, in addition to or instead of being disposed on the first opposing major surface 112. The optical coating 120 forms an appearance-enhancing surface 122.

The optical coating 120 includes at least one layer of at least one material. The term "layer" may include a single layer or may include one or more sub-layers. Such sub-layers may be in direct contact with one another. The sub-layers may be formed from the same material or two or more different materials. In one or more alternative embodiments, such sub-layers may have intervening layers of different materials disposed therebetween. In one or more embodiments a layer may include one or more contiguous and uninterrupted layers and/or one or more discontinuous and interrupted layers (i.e., a layer having different materials formed adjacent to one another). A layer or sub-layers may be formed by any known method in the art, including discrete deposition or continuous deposition processes. In one or more embodiments, the layer may be formed using only continuous deposition processes, or, alternatively, only discrete deposition processes.

The thickness of the optical coating 120 may be about 1 µm or greater while still providing an article that exhibits the optical performance described herein. In some examples, the optical coating 120 thickness may be in the range from about 1 µm to about 20 µm (e.g., from about 1 µm to about 10 µm, or from about 1 µm to about 5 µm).

As used herein, the term "dispose" includes coating, depositing and/or forming a material onto a surface using any known method in the art. The disposed material may constitute a layer, as defined herein. The phrase "disposed on" includes the instance of forming a material onto a surface such that the material is in direct contact with the surface and also includes the instance where the material is formed on a surface, with one or more intervening material(s) is between the disposed material and the surface. The intervening material(s) may constitute a layer, as defined herein.

Figure 2:
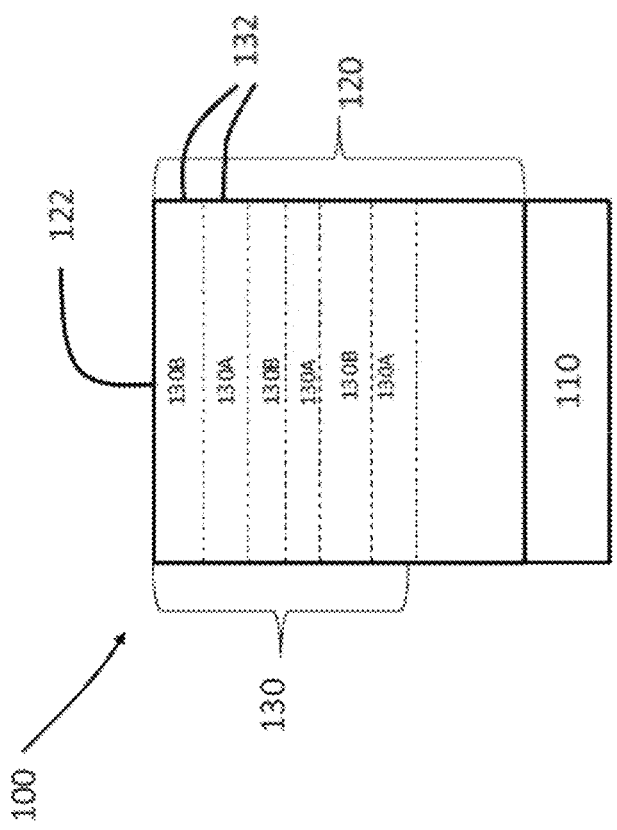
FIG. 2 is a side view of an article, according to one or more specific embodiments.

As shown in FIG. 2, the optical coating 120 includes an appearance-enhancing coating 130, which may include a plurality of layers (130A, 130B). In one or more embodiments, the appearance-enhancing coating 130 may include a period 132 comprising two or more layers. In one or more embodiments, the two or more layers may be characterized as having different refractive indices from each another. In one embodiment, the period 132 includes a first low RI layer 130A and a second high RI layer 130B. The difference in the refractive index of the first low RI layer and the second high RI layer may be about 0.01 or greater, 0.05 or greater, 0.1 or greater or even 0.2 or greater.

As shown in FIG. 2, the appearance-enhancing coating 130 may include a plurality of periods (132). A single period includes a first low RI layer 130A and a second high RI layer 130B, such that when a plurality of periods are provided, the first low RI layer 130A (designated for illustration as "L") and the second high RI layer 130B (designated for illustration as "H") alternate in the following sequence of layers: L/H/L/H or H/L/H/L, such that the first low RI layer and the second high RI layer appear to alternate along the physical thickness of the appearance-enhancing coating 130. In the example in FIG. 2, the appearance-enhancing coating 130 includes three periods. In some embodiments, the appearance-enhancing coating 130 may include up to 25 periods. For example, the appearance-enhancing coating 130 may include from about 2 to about 20 periods, from about 2 to about 15 periods, from about 2 to about 10 periods, from about 2 to about 12 periods, from about 3 to about 8 periods, from about 3 to about 6 periods.

Figure 3:
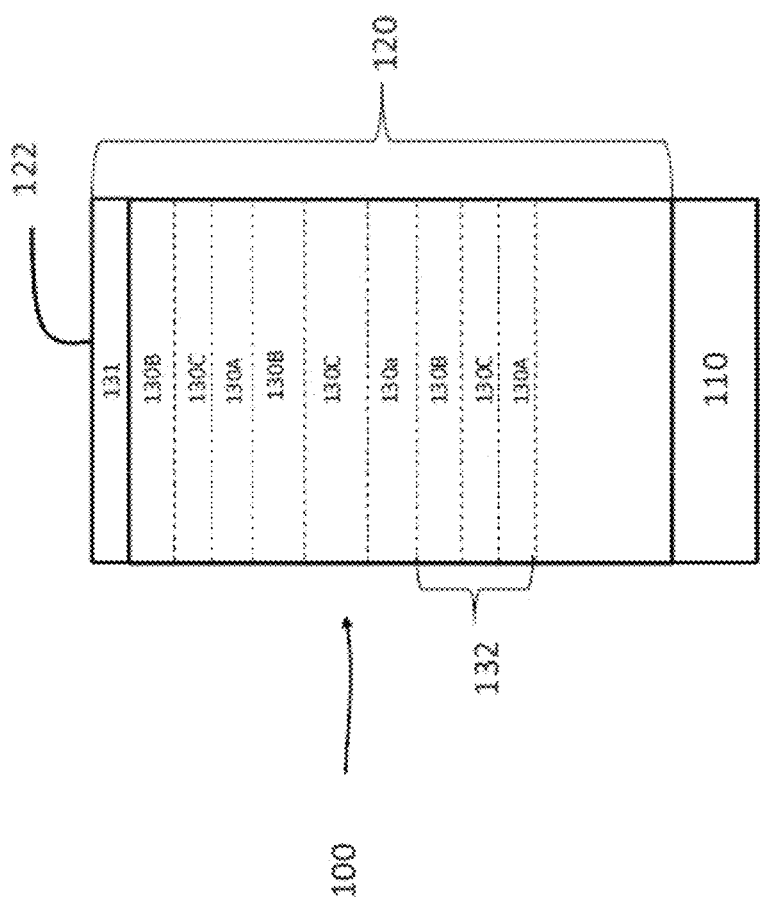
FIG. 3 is a side view of an article, according to one or more embodiments.

In the embodiment shown in FIG. 3, the appearance-enhancing coating 130 may include an additional capping layer 131, which may include a lower refractive index material than the second high RI layer 130B. In some embodiments, the period 132 may include one or more third layers 130C, as shown in FIG. 3. The third layer(s) 130C may have a low RI, a high RI or a medium RI. In some embodiments, the third layer(s) 130C may have the same RI as the first low RI layer 130A or the second high RI layer 130B. In other embodiments, the third layer(s) 130C may have a medium RI that is between the RI of the first low RI layer 130A and the RI of the second high RI layer 130B. Alternatively, the third layer(s) 130C may have a refractive index greater than the $2^{nd}$ high RI layer 130B. The third layer may be provided in the appearance-enhancing coating 130 in the following exemplary configurations: $L_{third\ layer}$/H/L/H/L; $H_{third\ layer}$/L/H/L/H; L/H/L/H/$L_{third\ layer}$; H/L/H/L/$H_{third\ layer}$; $L_{third\ layer}$/H/L/H/L/$H_{third\ layer}$; $H_{third\ layer}$/L/H/L/H/$L_{third\ layer}$; $L_{third\ layer}$/L/H/L/H; $H_{third\ layer}$/H/L/H/L; H/L/H/L/$L_{third\ layer}$; L/H/L/H/L/$H_{third\ layer}$; $L_{third\ layer}$/H/L/H/L; H/H/$H_{third\ layer}$; $H_{third\ layer}$/H/L/H/L/$L_{third\ layer}$; L/$M_{third\ layer}$/H/L/M/H; H/M/L/H/M/L; M/L/H/L/M; and other combinations. In these configurations, "L" without any subscript refers to the first low RI layer and "H" without any subscript refers to the second high RI layer. Reference to "$L_{third\ sub-layer}$" refers to a third layer having a low RI, "$H_{third\ sub-layer}$" refers to a third layer having a high RI and "M" refers to a third layer having a medium RI, all relative to the $1^{st}$ layer and the $2^{nd}$ layer.

As used herein, the terms "low RI", "high RI" and "medium RI" refer to the relative values for the RI to another (e.g., low RI<medium RI<high RI). In one or more embodiments, the term "low RI" when used with the first low RI layer or with the third layer, includes a range from about 1.3 to about 1.7 or 1.75. In one or more embodiments, the term "high RI" when used with the second high RI layer or with the third layer, includes a range from about 1.7 to about 2.5 (e.g., about 1.85 or greater). In some embodiments, the term "medium RI" when used with the third layer, includes a range from about 1.55 to about 1.8. In some instances, the ranges for low RI, high RI and medium RI may overlap; however, in most instances, the layers of the appearance-enhancing coating 130 have the general relationship regarding RI of: low RI<medium RI<high RI.

Figure 4:
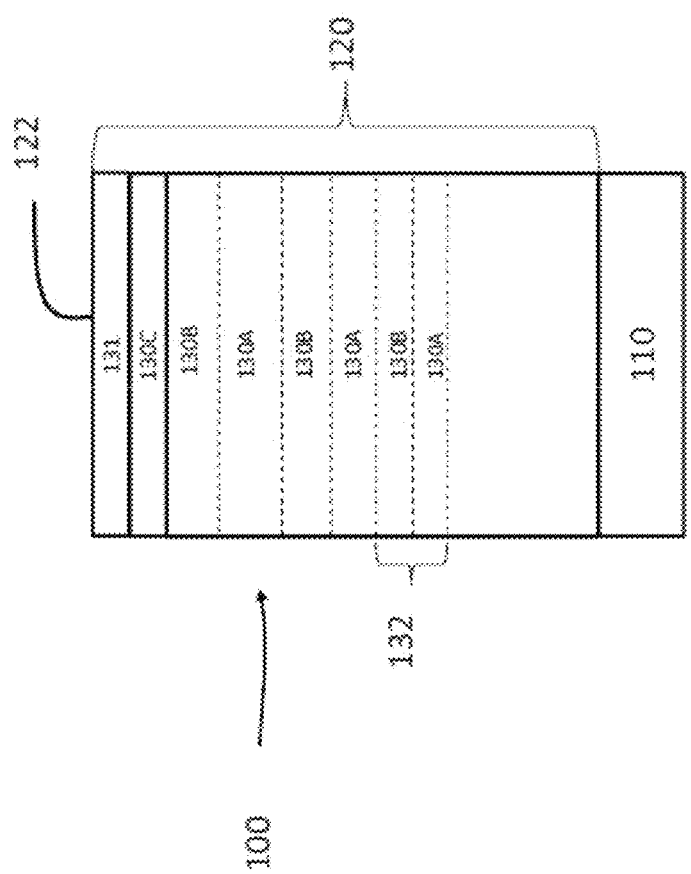
FIG. 4 is a side view of an article, according to one or more embodiments.
Figure 5:
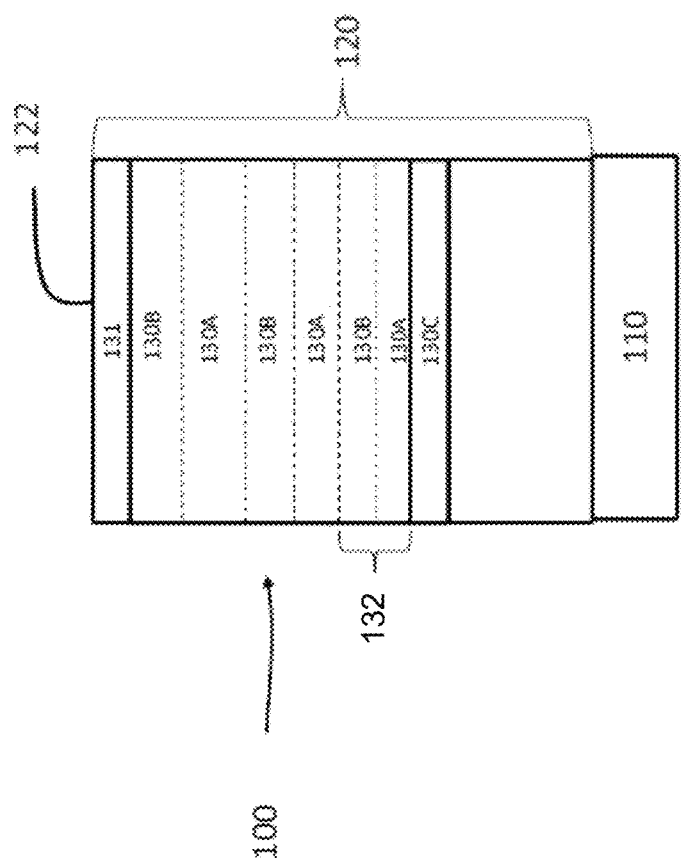
FIG. 5 is a side view of an article, according to one or more embodiments.
Figure 6:
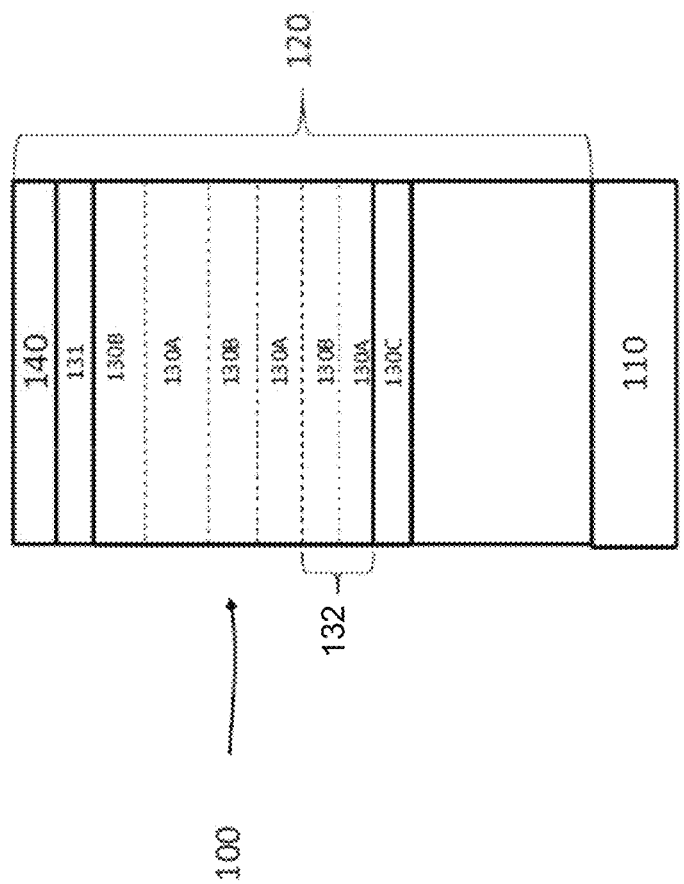
FIG. 6 is a side view of an article, according to one or more embodiments.

The third layer(s) 130C may be provided as a separate layer from a period 132 and may be disposed between the period or plurality of periods and the capping layer 131, as shown in FIG. 4. The third layer(s) may also be provided as a separate layer from a period 132 and may have disposed between the substrate 110 and the plurality of periods 132, as shown in FIG. 5. The third layer(s) 130C may be used in addition to an additional coating 140 instead of the capping layer 131 or in addition to the capping layer, as shown in FIG. 6.

Exemplary materials suitable for use in the appearance-enhancing coating 130 include: $SiO_2$, $Al_2O_3$, $GeO_2$, SiO, AlOxNy, AlN, SiNx, $SiO_xN_y$, $Si_uAl_vO_xN_y$, $Ta_2O_5$, $Nb_2O_5$, $TiO_2$, $ZrO_2$, TiN, MgO, $MgF_2$, $BaF_2$, $CaF_2$, $SnO_2$, $HfO_2$, $Y_2O_3$, $MoO_3$, $DyF_3$, $YbF_3$, $YF_3$, $CeF_3$, polymers, fluoropolymers, plasma-polymerized polymers, siloxane polymers, silsesquioxanes, polyimides, fluorinated polyimides, polyetherimide, polyethersulfone, polyphenylsulfone, polycarbonate, polyethylene terephthalate, polyethylene naphthalate, acrylic polymers, urethane polymers, polymethylmethacrylate, other materials cited below as suitable for use in a scratch-resistant layer, and other materials known in the art. Some examples of suitable materials for use in the first low RI layer include $SiO_2$, $Al_2O_3$, $GeO_2$, SiO, $AlO_xN_y$, $SiO_xN_y$, $Si_uAl_vO_xN_y$, MgO, $MgAl_2O_4$, $MgF_2$, $BaF_2$, $CaF_2$, $DyF_3$, $YbF_3$, $YF_3$, and $CeF_3$. The nitrogen content of the materials for use in the first low RI layer may be minimized (e.g., in materials such as $Al_2O_3$ and $MgAl_2O_4$). Some examples of suitable materials for use in the second high RI layer include $Si_uAl_vO_xN_y$, $Ta_2O_5$, $Nb_2O_5$, AlN, $Si_3N_4$, $AlO_xN_y$, $SiO_xN_y$, $SiN_x$, $SiN_x{:}H_y$, $HfO_2$, $TiO_2$, $ZrO_2$, $Y_2O_3$, $Al_2O_3$, $MoO_3$ and diamond-like carbon. In examples, the high RI layer may also be a high hardness layer or a scratch resistant layer, and the high RI materials listed above may also comprise high hardness or scratch resistance. The oxygen content of the materials for the second high RI layer and/or the scratch-resistant layer may be minimized, especially in SiNx or AlNx materials. $AlO_xN_y$ materials may be considered to be oxygen-doped AlNx, that is they may have an AlNx crystal structure (e.g. wurtzite) and need not have an AlON crystal structure. Exemplary preferred $AlO_xN_y$ high RI materials may comprise from about 0 atom % to about 20 atom % oxygen, or from about 5 atom % to about 15 atom % oxygen, while including 30 atom % to about 50 atom % nitrogen. Exemplary preferred $Si_uAl_vO_xN_y$ high RI materials may comprise from about 10 atom % to about 30 atom % or from about 15 atom % to about 25 atom % silicon, from about 20 atom % to about 40 atom % or from about 25 atom % to about 35 atom % aluminum, from about 0 atom % to about 20 atom % or from about 1 atom % to about 20 atom % oxygen, and from about 30 atom % to about 50 atom % nitrogen. The foregoing materials may be hydrogenated up to about 30% by weight. Where a material having a medium refractive index is desired, some embodiments may utilize AlN and/or $SiO_xN_y$. The hardness of the second high RI layer and/or the scratch-resistant layer may be characterized specifically. In some embodiments, the maximum hardness of the second high RI layer and/or the scratch-resistant layer, as measured by the Berkovich Indenter Hardness Test, may be about 8 GPa or greater, about 10 GPa or greater, about 12 GPa or greater, about 14 GPa or greater, or about 16 GPa or greater. These hardness values may be measured at indentation depths greater than 100 nm, greater than 250 nm, or greater than 500 nm. In some cases, the second high RI layer material may be deposited as a single layer and may be characterized as a scratch resistant layer, and this single layer may have a thickness between about 500 and 2000 nm for repeatable hardness determination.

It is common to describe solids with "whole number formula" descriptions, such as $Al_2O_3$. It is also common to describe solids using an equivalent "atomic fraction formula" description such as $AlO_{0.4}O_{0.6}$, which is equivalent to $Al_2O_3$. In the atomic fraction formula, the sum of all atoms in the formula is 0.4+0.6=1, and the atomic fractions of Al and O in the formula are 0.4 and 0.6 respectively. Atomic fraction descriptions are described in many general chemistry textbooks (see, for example, *Chemistry* 9th Edition, Zumdahl, Zumdahl (Authors), 2014, Brooks Cole Publishers), and atomic fraction descriptions are often used to describe alloys.

To speak generally about an alloy, such as aluminum oxide, without specifying the particular subscript values, we can speak of $Al_vO_x$. The description $Al_vO_x$ can represent either $Al_2O_3$ or $Al_{0.4}O_{0.6}$. If v+x were chosen to sum to 1 (i.e. v+x=1), then the formula would be an atomic fraction description. Similarly, more complicated mixtures can be described, such as $Si_uAl_vO_xN_y$, where again, if the sum u+v+x+y were equal to 1, we would have the atomic fractions description case.

Atomic fraction formulas are sometimes easier to use in comparisons. For instance; an example alloy consisting of $(Al_2O_3)_{0.3}(AlN)_{0.7}$ is closely equivalent to the formula descriptions $Al_{0.448}O_{0.31}N_{0.241}$ and also $Al_{367}O_{254}N_{198}$. Another example alloy consisting of $(Al_2O_3)_{0.4}(AlN)_{0.6}$ is closely equivalent to the formula descriptions $Al_{0.438}O_{0.375}N_{0.188}$ and $Al_{37}O_{32}N_{16}$. The atomic fraction formulas $Al_{0.448}O_{0.31}N_{0.241}$ and $Al_{0.438}O_{0.375}N_{0.188}$ are relatively easy to compare to one another; For instance, we see that Al decreased in atomic fraction by 0.01, O increased in atomic fraction by 0.065 and N decreased in atomic fraction by 0.053. It takes more detailed calculation and consideration to compare the whole number formula descriptions $Al_{367}O_{254}N_{198}$ and $Al_{37}O_{32}N_{16}$. Therefore, it is sometimes preferable to use atomic fraction formula descriptions of solids. Nonetheless, the use of $Al_vO_xN_y$ is general since it captures any alloy containing Al, O and N atoms.

In one or more embodiments at least one of the layer(s) of the appearance-enhancing coating 130 may include a specific optical thickness range. As used herein, the term "optical thickness" is determined by (n*d), where "n" refers to the RI of the sub-layer and "d" refers to the physical thickness of the layer. In one or more embodiments, at least one of the layers of the appearance-enhancing coating 130 may include an optical thickness in the range from about 2 nm to about 200 nm, from about 10 nm to about 100 nm, from about 15 nm to about 100 nm, from about 15 to about 500 nm, or from about 15 to about 5000 nm. In some embodiments, all of the layers in the appearance-enhancing coating 130 may each have an optical thickness in the range from about 2 nm to about 200 nm, from about 10 nm to about 100 nm, from about 15 nm to about 100 nm, from about 15 to about 500 nm, or from about 15 to about 5000 nm. In some cases, at least one layer of the appearance-enhancing coating 130 has an optical thickness of about 50 nm or greater. In some cases, each of the first low RI layers have an optical thickness in the range from about 2 nm to about 200 nm, from about 10 nm to about 100 nm, from about 15 nm to about 100 nm, from about 15 to about 500 nm, or from about 15 to about 5000 nm. In other cases, each of the second high RI layers have an optical thickness in the range from about 2 nm to about 200 nm, from about 10 nm to about 100 nm, from about 15 nm to about 100 nm, from about 15 to about 500 nm, or from about 15 to about 5000 nm. In yet other cases, each of the third layers have an optical thickness in the range from about 2 nm to about 200 nm, from about 10 nm to about 100 nm, from about 15 nm to about 100 nm, from about 15 to about 500 nm, or from about 15 to about 5000 nm.

In some embodiments, the thickness of one or more of the layers of the appearance-enhancing coating 130 may be minimized. In one or more embodiments, the thickness of the thickness of the high RI layer(s) and/or the medium RI layer(s) are minimized such that they are less than about 500 nm. In one or more embodiments, the combined thickness of the high RI layer(s), the medium RI (layers) and/or the combination of the high RI and medium RI layers is less than about 500 nm.

In some embodiments, the amount of low RI material in the optical coating may be minimized. Without being bound by theory, the low RI material is typically also a lower-hardness material, owing to the nature of atomic bonding and electron densities that simultaneously affect refractive index and hardness, and thus minimizing such material can maximize the hardness, while maintaining the reflectance and color performance described herein. Expressed as a fraction of physical thickness of the optical coating, the low RI material may comprise less than about 60%, less than about 50%, less than about 40%, less than about 30%, less than about 20%, less than about 10%, or less than about 5% of the physical thickness of the optical coating. Alternately or additionally, the amount of low RI material may be quantified as the sum of the physical thicknesses of all layer of low RI material that are disposed above the thickest high RI layer in the optical coating (i.e. on the side opposite the substrate, user side or air side). Without being bound by theory, the thick high RI layer having a high hardness effectively shields the layers underneath (or between the thick RI layer and the substrate) from many or most scratches. Accordingly, the layers disposed above the thickest high RI layer may have an outsized effect on scratch resistance of the overall article. This is especially relevant when the thickest high RI layer has a physical thickness that is greater than about 400 nm and has a hardness greater than about 12 GPa as measured by the Berkovich Indenter Hardness Test. The amount of low RI material disposed on the thickest high RI layer (i.e. on the side opposite the substrate, user side or air side) may have a thickness less than or equal to about 150 nm, less than or equal to about 120 nm, less than or equal to about 110 nm, 100 nm, 90 nm, 80 nm, 70 nm, 60 nm, 50 nm, 40 nm, 30 nm, 25 nm, 20 nm, 15 nm, or less than or equal to about 12 nm.

In some embodiments, the top-most air-side layer may comprise a high RI layer that also exhibits high hardness, as shown in Modeled Example 9. In some embodiments, an additional coating 140 may be disposed on top of this top-most air-side high RI layer (e.g., the additional coating may include low-friction coating, an oleophobic coating, or an easy-to-clean coating). Moreover, as illustrated by Modeled Example 10, the addition of a low RI layer having a very low thickness (e.g., about 10 nm or less, about 5 nm or less or about 2 nm or less) has minimal influence on the optical performance, when added to the top-most air-side layer comprising a high RI layer. The low RI layer having a very low thickness may include $SiO_2$, an oleophobic or low-friction layer, or a combination of $SiO_2$ and an oleophobic material. Exemplary low-friction layers may include diamond-like carbon, such materials (or one or more layers of the optical coating) may exhibit a coefficient of friction less than 0.4, less than 0.3, less than 0.2, or even less than 0.1.

In one or more embodiments, the appearance-enhancing coating 130 has a physical thickness of about 800 nm or less. The appearance-enhancing coating 130 may have a physical thickness in the range from about 10 nm to about 800 nm, from about 50 nm to about 800 nm, from about 100 nm to about 800 nm, from about 150 nm to about 800 nm, from about 200 nm to about 800 nm, from about 10 nm to about 750 nm, from about 10 nm to about 700 nm, from about 10 nm to about 650 nm, from about 10 nm to about 600 nm, from about 10 nm to about 550 nm, from about 10 nm to about 500 nm, from about 10 nm to about 450 nm, from about 10 nm to about 400 nm, from about 10 nm to about 350 nm, from about 10 nm to about 300 nm, from about 50 to about 300, and all ranges and sub-ranges therebetween.

In one or more embodiments, the combined physical thickness of the second high RI layer(s) may be characterized. For example, in some embodiments, the combined thickness of the second high RI layer(s) may be about 100 nm or greater, about 150 nm or greater, about 200 nm or greater, about 500 nm or greater. The combined thickness is the calculated combination of the thicknesses of the individual high RI layer(s) in the appearance-enhancing coating 130, even when there are intervening low RI layer(s) or other layer(s). In some embodiments, the combined physical thickness of the second high RI layer(s), which may also comprise a high-hardness material (e.g., a nitride or an oxynitride material), may be greater than 30% of the total physical thickness of the appearance-enhancing coating. For example, the combined physical thickness of the second high RI layer(s) may be about 40% or greater, about 50% or greater, about 60% or greater, about 70% or greater, about 75% or greater, or even about 80% or greater, of the total physical thickness of the appearance-enhancing coating. Additionally or alternatively, the amount of the high refractive index material, which may also be a high-hardness material, included in the optical coating may be characterized as a percentage of the physical thickness of the upper most (i.e., user side or side of the optical coating opposite the substrate) 500 nm of the article or optical coating 120. Expressed as a percentage of the upper most 500 nm of the article or optical coating, the combined physical thickness of the second high RI layer(s) (or the thickness of the high refractive index material) may be about 50% or greater, about 60% or greater, about 70% or greater, about 80% or greater, or even about 90% or greater. In some embodiments, greater proportions of hard and high-index material within the appearance-enhancing coating can also simultaneously be made to also exhibit low reflectance, low color, and high abrasion resistance as further described elsewhere herein. In one or more embodiments, the second high RI layers may include a material having a refractive index greater than about 1.85 and the first low RI layers may include a material having a refractive index less than about 1.75. In some embodiments, the second high RI layers may include a nitride or an oxynitride material. In some instances, the combined thickness of all the first low RI layers in the optical coating (or in the layers that are disposed on the thickest second high RI layer of the optical coating) may be about 200 nm or less (e.g., about 150 nm or less, about 100 nm or less, about 75 nm or less, or about 50 nm or less).

The article 100 may include one or more additional coatings 140 disposed on the appearance-enhancing coating, as shown in FIG. 6. In one or more embodiments, the additional coating may include an easy-to-clean coating. An example of a suitable an easy-to-clean coating is described in U.S. patent application Ser. No. 13/690,904, entitled "PROCESS FOR MAKING OF GLASS ARTICLES WITH OPTICAL AND EASY-TO-CLEAN COATINGS," filed on Nov. 30, 2012, which is incorporated herein in its entirety by reference. The easy-to-clean coating may have a thickness in the range from about 5 nm to about 50 nm and may include known materials such as fluorinated silanes. The easy-to-clean coating may alternately or additionally comprise a low-friction coating or surface treatment. Exemplary low-friction coating materials may include diamond-like carbon, silanes (e.g. fluorosilanes), phosphonates, alkenes, and alkynes. In some embodiments, the easy-to-clean coating may have a thickness in the range from about 1 nm to about 40 nm, from about 1 nm to about 30 nm, from about 1 nm to about 25 nm, from about 1 nm to about 20 nm, from about 1 nm to about 15 nm, from about 1 nm to about 10 nm, from about 5 nm to about 50 nm, from about 10 nm to about 50 nm, from about 15 nm to about 50 nm, from about 7 nm to about 20 nm, from about 7 nm to about 15 nm, from about 7 nm to about 12 nm or from about 7 nm to about 10 nm, and all ranges and sub-ranges therebetween.

The additional coating 140 may include a scratch resistant layer or layers. In some embodiments, the additional coating 140 includes a combination of easy-to-clean material and scratch resistant material. In one example, the combination includes an easy-to-clean material and diamond-like carbon. Such additional coatings 140 may have a thickness in the range from about 5 nm to about 20 nm. The constituents of the additional coating 140 may be provided in separate layers. For example, the diamond-like carbon may be disposed as a first layer and the easy-to clean can be disposed as a second layer on the first layer of diamond-like carbon. The thicknesses of the first layer and the second layer may be in the ranges provided above for the additional coating. For example, the first layer of diamond-like carbon may have a thickness of about 1 nm to about 20 nm or from about 4 nm to about 15 nm (or more specifically about 10 nm) and the second layer of easy-to-clean may have a thickness of about 1 nm to about 10 nm (or more specifically about 6 nm). The diamond-like coating may include tetrahedral amorphous carbon (Ta—C), Ta—C:H, and/or a-C—H.

Figure 7:
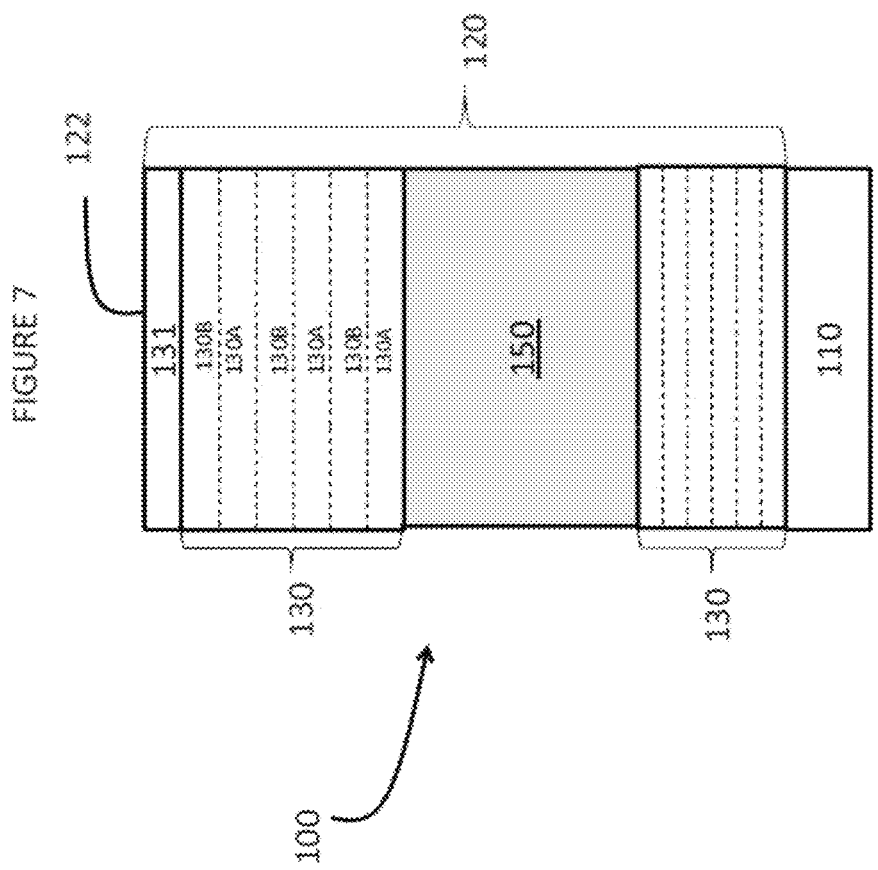
FIG. 7 is a side view of an article, according to one or more embodiments.

As mentioned herein, the optical coating 120 may include a scratch resistant layer 150 or coating (when a plurality of scratch resistant layers are utilized), which may be disposed between the appearance-enhancing coating 130 and the substrate 110. In some embodiment, the scratch resistant layer 150 or coating is disposed between the layers of the appearance-enhancing coating 130 (such as 150 as shown in FIG. 7). The two sections of the appearance-enhancing coating (i.e., a first section disposed between the scratch resistant layer 150 and the substrate 110, and a second section disposed on the scratch resistant layer) may have a different thickness from one another or may have essentially the same thickness as one another. The layers of the two sections of the appearance-enhancing coating may be the same in composition, order, thickness and/or arrangement as one another or may differ from one another.

Exemplary materials used in the scratch resistant layer 150 or coating (or the scratch-resistant layer/coating used as an additional coating 140) may include an inorganic carbide, nitride, oxide, diamond-like material, or combination of these. Examples of suitable materials for the scratch resistant layer or coating include metal oxides, metal nitrides, metal oxynitride, metal carbides, metal oxycarbides, and/or combinations thereof combination thereof. Exemplary metals include B, Al, Si, Ti, V, Cr, Y, Zr, Nb, Mo, Sn, Hf, Ta and W. Specific examples of materials that may be utilized in the scratch resistant layer or coating may include $Al_2O_3$, AlN, $AlO_xN_y$, $Si_3N_4$, $SiO_xN_y$, $Si_uAl_vO_xN_y$, diamond, diamond-like carbon, $Si_xC_y$, $Si_xO_yC_z$, $ZrO_2$, $TiO_xN_y$, and combinations thereof. The scratch resistant layer or coating may also comprise nanocomposite materials, or materials with a controlled microstructure to improve hardness, toughness, or abrasion/wear resistance. For example the scratch resistant layer or coating may comprise nanocrystallites in the size range from about 5 nm to about 30 nm. In embodiments, the scratch resistant layer or coating may comprise transformation-toughened zirconia, partially stabilized zirconia, or zirconia-toughened alumina. In embodiments, the scratch resistant layer or coating exhibits a fracture toughness value greater than about 1 MPa$\sqrt{m}$ and simultaneously exhibits a hardness value greater than about 8 GPa.

The scratch resistant layer may include a single layer 150 (as shown in FIG. 7), or multiple sub-layers or sub-layers or single layers that exhibit a refractive index gradient. Where multiple layers are used, such layers form a scratch resistant coating. For example, a scratch resistant coating may include a compositional gradient of $Si_uAl_vO_xN_y$ where the concentration of any one or more of Si, Al, O and N are varied to increase or decrease the refractive index. The refractive index gradient may also be formed using porosity. Such gradients are more fully described in U.S. patent application Ser. No. 14/262,224, entitled "Scratch-Resistant Articles with a Gradient Layer", filed on Apr. 28, 2014, which is hereby incorporated by reference in its entirety.

Figure 8:
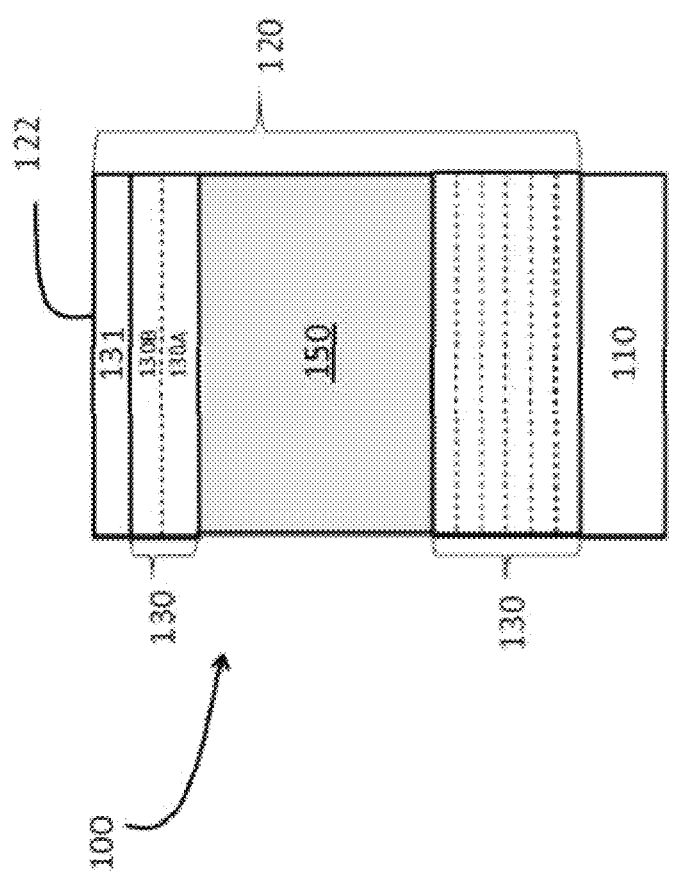
FIG. 8 is a side view of an article, according to one or more embodiments.

In one embodiment, depicted in FIG. 8, the optical coating 120 may comprise a scratch resistant layer 150 that is integrated as a high RI layer, and one or more low RI layers 130A and high RI layers 130B may be positioned over the scratch resistant layer 150, with an optional capping layer 131 positioned over the low RI layers 130A and high RI layers 130B, where the capping layer 131 comprises a low RI material. The scratch resistant layer may be alternately defined as the thickest hard layer or the thickest high RI layer in the overall optical coating or in the overall article. Without being bound by theory, it is believed that the article 100 may exhibit increased hardness at indentation depths when a relatively thin amount of material is deposited over the scratch resistant layer 150. However, the inclusion of low RI and high RI layers over the scratch resistant layer 150 may enhance the optical properties of the article 100. In some embodiments, relatively few layers (e.g., only 1, 2, 3, 4, or 5 layers) may positioned over the scratch resistant layer 150 and these layers may each be relatively thin (e.g. less than 100 nm, less than 75 nm, less than 50 nm, or even less than 25 nm).

In embodiments, the layers deposited over the scratch resistant layer 150 (i.e., on the air side of the scratch resistant layer 150) may have a total thickness (i.e., in combination) of less than or equal to about 1000 nm, less than or equal to about 500 nm, less than or equal to about 450 nm, less than or equal to about 400 nm, less than or equal to about 350 nm, less than or equal to about 300 nm, less than or equal to about 250 nm, less than or equal to about 225 nm, less than or equal to about 200 nm, less than or equal to about 175 nm, less than or equal to about 150 nm, less than or equal to about 125 nm, less than or equal to about 100 nm, less than or equal to about 90 nm, less than or equal to about 80 nm, less than or equal to about 70 nm, less than or equal to about 60 nm, or even less than or equal to about 50 nm.

In embodiments, the total thickness of low RI layer(s) (the sum of thickness of all low RI layers, even if they are not in contact) that are positioned over the scratch resistant layer 150 (i.e., on the air side of the scratch resistant layer 150) may be less than or equal to about 500 nm, less than or equal to about 450 nm, less than or equal to about 400 nm, less than or equal to about 350 nm, less than or equal to about 300 nm, less than or equal to about 250 nm, less than or equal to about 225 nm, less than or equal to about 200 nm, less than or equal to about 175 nm, less than or equal to about 150 nm, less than or equal to about 125 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, or even less than or equal to about 10 nm.

In embodiments, the optical coating 120 may comprise, in the uppermost 500 nm of thickness (i.e., on the air side of the optical coating 120), at least about 50%, at least about 55%, at least about 60%, at least about 65%, at least about 70%, at least about 75%, at least about 80%, at least about 85%, at least about 90%, or even at least about 95% of high RI (high hardness) material, when calculated as a thickness percentage or a volume percentage of the uppermost 500 nm of material. For example, when the layers positioned over the scratch resistant layer 150 are relatively thin, the scratch resistant layer 150 which may be made of a hard material may comprise the majority of the uppermost 500 nm of the optical coating 120. In embodiments, the optical coating 120 may comprise, in the uppermost 500 nm of thickness (i.e., on the air side of the optical coating 120), less than about 50%, less than about 45%, less than about 40%, less than about 35%, less than about 30%, less than about 25%, less than about 20%, less than about 15%, less than about 10%, or even less than about 5% of low RI (low hardness) material.

The composition of the scratch resistant layer or coating may be modified to provide specific properties (e.g., hardness). In one or more embodiments, the scratch resistant layer or coating exhibits a maximum hardness in the range from about 5 GPa to about 30 GPa as measured on a major surface of the scratch resistant layer or coating, by the Berkovich Indenter Hardness Test. In one or more embodiments, the scratch resistant layer or coating exhibits a maximum hardness in the range from about 6 GPa to about 30 GPa, from about 7 GPa to about 30 GPa, from about 8 GPa to about 30 GPa, from about 9 GPa to about 30 GPa, from about 10 GPa to about 30 GPa, from about 12 GPa to about 30 GPa, from about 5 GPa to about 28 GPa, from about 5 GPa to about 26 GPa, from about 5 GPa to about 24 GPa, from about 5 GPa to about 22 GPa, from about 5 GPa to about 20 GPa, from about 12 GPa to about 25 GPa, from about 15 GPa to about 25 GPa, from about 16 GPa to about 24 GPa, from about 18 GPa to about 22 GPa and all ranges and sub-ranges therebetween. In one or more embodiments, the scratch resistant coating may exhibit a maximum hardness that is greater than 15 GPa, greater than 20 GPa, or greater than 25 GPa. In one or more embodiments, the scratch resistant layer exhibits a maximum hardness in the range from about 15 GPa to about 150 GPa, from about 15 GPa to about 100 GPa, or from about 18 GPa to about 100 GPa. Maximum hardness is the highest hardness value measured over a range of indentation depths. Such maximum hardness values are exhibited along an indentation depth of about 50 nm or greater or 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm).

In embodiments, the article 100 comprises a hardness profile, which may be defined by the nanohardness of the article at a combination of indentation depths. For example, the article may exhibit a hardness profile where the article 100 has a nanohardness of greater than a specified value at about a 100 nm indentation depth and/or a nanohardness of greater than another specified value at about a 300 nm indentation depth and/or a nanohardness of greater than another specified value at about a 500 nm indentation depth and/or a nanohardness of greater than another specified value at about a 700 nm indentation depth. For example two or more indentations depths may be selected to establish a hardness profile. Having high hardness that extends out to deeper indentation depths helps protect against more severe scratch events responsible for more visible scratches. Maintaining higher hardness at shallower indentation depths helps to protect against less severe scratch events. Accordingly, it is desirable to have a hardness profile wherein the hardness quickly increases at shallow indentation depths (for example, from the surface up to 100 nm), and is maintained as deep as possible, for example at depths from 100 nm up to about 700 or 800 nm, as measured from the surface. In embodiments, the article 100 may comprise a hardness of at least about 5 GPa, at least about 6 GPa, at least about at least about 7 GPa, at least about 8 GPa, at least about 9 GPa, at least about 10 GPa, at least about 11 GPa, at least about 12 GPa, at least about 13 GPa, at least about 14 GPa, at least about 15 GPa, at least about 16 GPa, at least about 17 GPa, at least about 18 GPa, at least about 19 GPa, at least about 20 GPa, at least about 22 GPa, or even at least about 25 GPa at an indentation depth of 100 nm; may also comprise a harness of at least about 5 GPa, at least about 6 GPa, at least about at least about 7 GPa, at least about 8 GPa, at least about 9 GPa, at least about 10 GPa, at least about 11 GPa, at least about 12 GPa, at least about 13 GPa, at least about 14 GPa, at least about 15 GPa, at least about 16 GPa, at least about 17 GPa, at least about 18 GPa, at least about 19 GPa, at least about 20 GPa, at least about 22 GPa, or even at least about 25 GPa at an indentation depth of 300 nm; may comprise a hardness of at least about 5 GPa, at least about 6 GPa, at least about at least about 7 GPa, at least about 8 GPa, at least about 9 GPa, at least about 10 GPa, at least about 11 GPa, at least about 12 GPa, at least about 13 GPa, at least about 14 GPa, at least about 15 GPa, at least about 16 GPa, at least about 17 GPa, at least about 18 GPa, at least about 19 GPa, at least about 20 GPa, at least about 22 GPa, or even at least about 25 GPa at an indentation depth of 500 nm; and/or may comprise a hardness of at least about 5 GPa, at least about 6 GPa, at least about at least about 7 GPa, at least about 8 GPa, at least about 9 GPa, at least about 10 GPa, at least about 11 GPa, at least about 12 GPa, at least about 13 GPa, at least about 14 GPa, at least about 15 GPa, at least about 16 GPa, at least about 17 GPa, at least about 18 GPa, at least about 19 GPa, at least about 20 GPa, at least about 22 GPa, or even at least about 25 GPa at an indentation depth of 700 nm. For example, embodiments described herein may have a hardness of at least about 12 GPa at a 100 nm indentation depth, a hardness of at least about 15 GPa at a 300 nm indentation depth, a hardness of at least about 15 GPa at a 500 nm indentation depth, and a hardness of at least about 15 GPa at a 700 nm indentation depth.

The physical thickness of the scratch resistant coating or layer may be in the range from about 1 nm to about 5 μm. In some embodiments, the physical thickness of the scratch resistant coating may be in the range from about 1 nm to about 3 μm, from about 1 nm to about 2.5 μm, from about 1 nm to about 2 μm, from about 1 nm to about 1.5 μm, from about 1 nm to about 1 μm, from about 1 nm to about 0.5 μm, from about 1 nm to about 0.2 μm, from about 1 nm to about 0.1 μm, from about 1 nm to about 0.05 μm, from about 5 nm to about 0.05 μm, from about 10 nm to about 0.05 μm, from about 15 nm to about 0.05 μm, from about 20 nm to about 0.05 μm, from about 5 nm to about 0.05 μm, from about 100 nm to about 3 μm, from about 150 nm to about 3 μm, from about 200 nm to about 3 μm, from about 250 nm to about 3 μm, from about 300 nm to about 3 μm, from about 350 nm to about 3 μm, from about 400 nm to about 3 μm, from about 500 nm to about 3 μm, from about 600 nm to about 3 μm, from about 700 nm to about 3 μm, from about 800 nm to about 3 μm, and all ranges and sub-ranges therebetween. In some embodiments, the physical thickness of the scratch resistant coating may be in the range from about 1 nm to about 25 nm. In some instances, the scratch-resistant layer may include a nitride or an oxy-nitride material and may have a thickness of about 200 nm or greater, 500 nm or greater or about 1000 nm or greater.

The article of one or more embodiments may be described as abrasion resistant as measured by various methods, after being abraded on the appearance-enhancing surface 122 according to a Taber Test after at least about 500 cycles. Various forms of abrasion test are known in the art, such as the test method specified in ASTM D1044-99, using abrasive media supplied by Taber Industries. Modified abrasion methods related to ASTM D1044-99 can be created using different types of abrading media, abradant geometry and motion, pressure, etc. in order to provide repeatable and measurable abrasion or wear tracks to meaningfully differentiate the abrasion resistance of different samples. For example, different test conditions will usually be appropriate for soft plastics vs. hard inorganic test samples. The embodiments described herein were subjected to a Taber Test, as defined herein, which is a specific modified version of ASTM D1044-99 that gives clear and repeatable differentiation of durability between different samples which comprise primarily hard inorganic materials, such as oxide glasses and oxide or nitride coatings. As used herein, the phrase "Taber Test" refers to a test method using a Taber Linear Abraser 5750 (TLA 5750) and accessories supplied by Taber Industries, in an environment including a temperature of about 22° C.±3° C. and Relative Humidity of up to about 70%. The TLA 5750 includes a CS-17 abraser material having a 6.7 mm diameter abraser head. Each sample was abraded according to the Taber Test and the abrasive damage was evaluated using roughness evaluation with an atomic force microscope (AFM), as described below. In the Taber Test, the procedure for abrading each sample includes placing the TLA 5750 and a flat sample support on a rigid, flat surface and securing the TLA 5750 and the sample support to the surface. Before each sample is abraded under the Taber Test, the abraser is refaced using a new S-14 refacing strip adhered to glass. The abraser is subjected to 10 refacing cycles using a cycle speed of 25 cycles/minute and stroke length of 1 inch, with no additional weight added (i.e., a total weight of about 350 g is used during refacing, which is the combined weight of the spindle and collet holding the abraser). The procedure then includes operating the TLA 5750 to abrade the sample, where the sample is placed in the sample support in contact with the abraser head and supporting the weight applied to the abraser head, using a cycle speed of 25 cycles/minute, and a stroke length of 1 inch, and a weight such that the total weight applied to the sample is 850 g (i.e., a 500 g auxiliary weight is applied in addition to the 350 g combined weight of the spindle and collet). The procedure includes forming two wear tracks on each sample for repeatability, and abrading each sample for 500 cycle counts in each of the two wear tracks on each sample.

In one or more embodiments, article 100 abraded by the Taber Test on the appearance-enhancing surface 122 may exhibit an abrasion resistance as measured by AFM surface profiling, which may be carried out for example over an 80×80 micron area, or multiple 80×80 micron areas (to sample a larger portion of the abraded area) of the appearance-enhancing surface 122. From these AFM surface scans, surface roughness statistics such as RMS roughness, Ra roughness, and peak-to-valley surface height may be evaluated. In one or more embodiments, the article 100 (or specifically, the appearance-enhancing surface 122) may exhibit average surface roughness (Ra) values of about 50 nm or less, about 25 nm or less, about 12 nm or less, about 10 nm or less, or about 5 nm or less, after being abraded under the Taber Test described above.

The optical coating 120 and the article 100 may be described in terms of a hardness measured by a Berkovich Indenter Hardness Test, as described above. The Berkovich Indenter Hardness Test includes indenting the appearance-enhancing surface 122 of the article or the surface of the optical coating 120 (or the surface of any one or more of the layers in the appearance-enhancing coating) with the diamond Berkovich indenter to form an indent to an indentation depth in the range from about 50 nm to about 1000 nm (or the entire thickness of the appearance-enhancing coating or layer, whichever is less) and measuring the maximum (or minimum) hardness from this indentation along the entire indentation depth range or a segment of this indentation depth (e.g., in the range from about 100 nm to about 600 nm)

Typically, in nanoindentation measurement methods (such as by using a Berkovich indenter) of a coating that is harder than the underlying substrate, the measured hardness may appear to increase initially due to development of the plastic zone at shallow indentation depths and then increases and reaches a maximum value or plateau at deeper indentation depths. Thereafter, hardness begins to decrease at even deeper indentation depths due to the effect of the underlying substrate. Where a substrate having an increased hardness compared to the coating is utilized, the same effect can be seen; however, the hardness increases at deeper indentation depths due to the effect of the underlying substrate.

The indentation depth range and the hardness values at certain indentation depth range(s) can be selected to identify a particular hardness response of the optical coating structures and layers thereof, described herein, without the effect of the underlying substrate. When measuring hardness of the optical coating structure (when disposed on a substrate) with a Berkovich indenter, the region of permanent deformation (plastic zone) of a material is associated with the hardness of the material. During indentation, an elastic stress field extends well beyond this region of permanent deformation. As indentation depth increases, the apparent hardness and modulus are influenced by stress field interactions with the underlying substrate. The substrate influence on hardness occurs at deeper indentation depths (i.e., typically at depths greater than about 10% of the optical coating structure or layer thickness). Moreover, a further complication is that the hardness response requires a certain minimum load to develop full plasticity during the indentation process. Prior to that certain minimum load, the hardness shows a generally increasing trend.

At small indentation depths (which also may be characterized as small loads) (e.g., up to about 50 nm), the apparent hardness of a material appears to increase dramatically versus indentation depth. This small indentation depth regime does not represent a true metric of hardness but instead, reflects the development of the aforementioned plastic zone, which is related to the finite radius of curvature of the indenter. At intermediate indentation depths, the apparent hardness approaches maximum levels. At deeper indentation depths, the influence of the substrate becomes more pronounced as the indentation depths increase. Hardness may begin to drop dramatically once the indentation depth exceeds about 30% of the optical coating structure thickness or the layer thickness.

Figure 9:
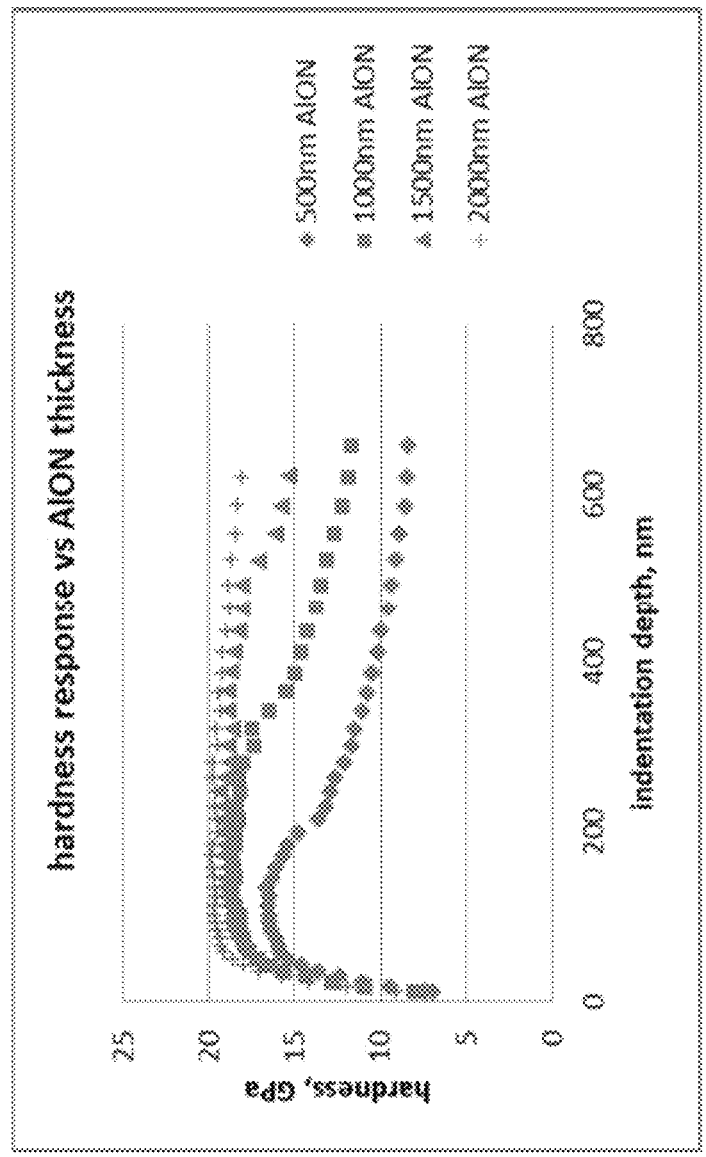
FIG. 9 is a graph illustrating the hardness measurements as a function of indentation depth and coating thickness.

FIG. 9 illustrates the changes in measured hardness value as a function of indentation depth and thickness of a coating. As shown in FIG. 9, the hardness measured at intermediate indentation depths (at which hardness approaches and is maintained at maximum levels) and at deeper indentation depths depends on the thickness of a material or layer. FIG. 9 illustrates the hardness response of four different layers of $AlO_xN_y$ having different thicknesses. The hardness of each layer was measured using the Berkovich Indenter Hardness Test. The 500 nm-thick layer exhibited its maximum hardness at indentation depths from about 100 nm to 180 nm, followed by a dramatic decrease in hardness at indentation depths from about 180 nm to about 200 nm, indicating the hardness of the substrate influencing the hardness measurement. The 1000 nm-thick layer exhibited a maximum hardness at indentation depths from about 100 nm to about 300 nm, followed by a dramatic decrease in hardness at indentation depths greater than about 300 nm. The 1500 nm-thick layer exhibited a maximum hardness at indentation depths from about 100 nm to about 550 nm and the 2000-nm thick layer exhibited a maximum hardness at indentation depths from about 100 nm to about 600 nm. Although FIG. 9 illustrates a thick single layer, the same behavior is observed in thinner coatings and those including multiple layers such as the optical coating 120 of the embodiments described herein.

In some embodiments, the optical coating 120 may exhibit a hardness of about 8 GPa or greater, about 10 GPa or greater or about 12 GPa or greater (e.g., 14 GPa or greater, 16 GPa or greater, 18 GPa or greater, 20 GPa or greater). The hardness of the optical coating 120 may be up to about 20 GPa or 30 GPa. The article 100, including the appearance-enhancing coating 120 and any additional coatings, as described herein, exhibit a hardness of about 5 GPa or greater, about 8 GPa or greater, about 10 GPa or greater or about 12 GPa or greater (e.g., 14 GPa or greater, 16 GPa or greater, 18 GPa or greater, 20 GPa or greater), as measured on the appearance-enhancing surface 122, by a Berkovich Indenter Hardness Test. The hardness of the optical coating 120 may be up to about 20 GPa or 30 GPa. Such measured hardness values may be exhibited by the optical coating 120 and/or the article 100 along an indentation depth of about 50 nm or greater or about 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm). In one or more embodiments, the article exhibits a hardness that is greater than the hardness of the substrate (which can be measured on the opposite surface from the appearance-enhancing surface).

The optical coating 120 may have at least one layer having a hardness (as measured on the surface of such layer, e.g., surface of the second high RI layer 130B of FIG. 2 or the surface of the scratch resistant layer) of about 12 GPa or greater, about 13 GPa or greater, about 14 GPa or greater, about 15 GPa or greater, about 16 GPa or greater, about 17 GPa or greater, about 18 GPa or greater, about 19 GPa or greater, about 20 GPa or greater, about 22 GPa or greater, about 23 GPa or greater, about 24 GPa or greater, about 25 GPa or greater, about 26 GPa or greater, or about 27 GPa or greater (up to about 50 GPa), as measured by the Berkovich Indenter Hardness Test. The hardness of such layer may be in the range from about 18 GPa to about 21 GPa, as measured by the Berkovich Indenter Hardness Test. Such measured hardness values may be exhibited by the at least one layer along an indentation depth of about 50 nm or greater or 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm).

In one or more embodiments, the optical coating 120 or individual layers within the optical coating may exhibit an elastic modulus of about 75 GPa or greater, about 80 GPa or greater or about 85 GPa or greater, as measured on the appearance-enhancing surface 122, by indenting that surface with a Berkovich indenter. These modulus values may represent a modulus measured very close to the appearance-enhancing surface, e.g. at indentation depths of 0 nm to about 50 nm, or it may represent a modulus measured at deeper indentation depths, e.g. from about 50 nm to about 1000 nm.

In embodiments of the article which include a scratch-resistant layer (when used as part of the appearance-enhancing coating, e.g., 150 of FIG. 7) or scratch resistant coating (when used as an additional coating 140), the article may exhibit a maximum hardness in the range from about 12 GPa to about 25 GPa, as measured by the Berkovich Indenter Hardness Test on the appearance-enhancing surface 122, or the surface of the scratch resistant coating, respectively. Such measured hardness values may be exhibited along an indentation depth of about 50 nm or greater or 100 nm or greater (e.g., from about 100 nm to about 300 nm, from about 100 nm to about 400 nm, from about 100 nm to about 500 nm, from about 100 nm to about 600 nm, from about 200 nm to about 300 nm, from about 200 nm to about 400 nm, from about 200 nm to about 500 nm, or from about 200 nm to about 600 nm). This hardness may be exhibited even when the scratch resistant layer is not disposed at or near the appearance-enhancing surface 122 (e.g., as shown in FIGS. 7 and 8).

Optical interference between reflected waves from the optical coating 120/air interface and the optical coating 120/substrate 110 interface can lead to spectral reflectance and/or transmittance oscillations that create apparent color in the article 100. As used herein, the term "transmittance" is defined as the percentage of incident optical power within a given wavelength range transmitted through a material (e.g., the article, the substrate or the optical coating or portions thereof). The term "reflectance" is similarly defined as the percentage of incident optical power within a given wavelength range that is reflected from a material (e.g., the article, the substrate, or the optical coating or portions thereof). Transmittance and reflectance are measured using a specific linewidth. In one or more embodiments, the spectral resolution of the characterization of the transmittance and reflectance is less than 5 nm or 0.02 eV. The color may be more pronounced in reflection. The angular color shifts in reflection with viewing angle due to a shift in the spectral reflectance oscillations with incident illumination angle. Angular color shifts in transmittance with viewing angle are also due to the same shift in the spectral transmittance oscillation with incident illumination angle. The observed color and angular color shifts with incident illumination angle are often distracting or objectionable to device users, particularly under illumination with sharp spectral features such as fluorescent lighting and some LED lighting. Angular color shifts in transmission may also play a factor in color shift in reflection and vice versa. Factors in angular color shifts in transmission and/or reflection may also include angular color shifts due to viewing angle or angular color shifts away from a certain white point that may be caused by material absorption (somewhat independent of angle) defined by a particular illuminant or test system.

The oscillations may be described in terms of amplitude. As used herein, the term "amplitude" includes the peak-to-valley change in reflectance or transmittance. The phrase "average amplitude" includes the peak-to-valley change in reflectance or transmittance averaged over several oscillation cycles or wavelength sub-ranges within the optical wavelength regime. As used herein, the "optical wavelength regime" includes the wavelength range from about 400 nm to about 800 nm (and more specifically from about 450 nm to about 650 nm).

The embodiments of this disclosure include an appearance-enhancing coating to provide improved optical performance, under different illuminants.

In one or more embodiments, the article exhibits an angular color shift in reflectance and/or transmittance between a reference illumination angle and any incidental illumination angles in the ranges from about 20 degrees to about 60 degrees. As used herein, the phrase "color shift" (angular or reference point) refers to the change in both a* and b*, under the CIE L*, a*, b* colorimetry system in reflectance and/or transmittance. It should be understood that unless otherwise noted, the L* coordinate of the articles described herein are the same at any angle or reference point and do not influence color shift. For example, angular color shift may be determined using the following Equation (1):

$$\sqrt{((a^*_2-a^*_1)^2+(b^*_2-b^*_1)^2)}, \quad (1)$$

with $a^*_1$, and $b^*_1$ representing the a* and b* coordinates of the article when viewed at incidence reference illumination angle (which may include normal incidence) and $a^*_2$, and $b^*_2$ representing the a* and b* coordinates of the article when viewed at an incident illumination angle, provided that the incident illumination angle is different from the reference illumination angle and in some cases differs from the reference illumination angle by at least about 5 degrees, or about 10 degrees, or about 15 degrees, or about 20 degrees. An angular color shift in reflectance and/or transmittance is exhibited by the article when viewed at various incident illumination angles from a reference illumination angle, under an illuminant. The illuminant can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting).

The reference illumination angle may include normal incidence (i.e., from about 0 degrees to about 10 degrees), or 5 degrees from normal incidence, 10 degrees from normal incidence, 15 degrees from normal incidence, 20 degrees from normal incidence, 25 degrees from normal incidence, 30 degrees from normal incidence, 35 degrees from normal incidence, 40 degrees from normal incidence, 50 degrees from normal incidence, 55 degrees from normal incidence, or 60 degrees from normal incidence, provided the difference between the reference illumination angle and the difference between the incident illumination angle and the reference illumination angle is at least about 5 degrees, or about 10 degrees, or about 15 degrees, or about 20 degrees. The incident illumination angle may be, with respect to the reference illumination angle, in the range from about 5 degrees to about 80 degrees, from about 5 degrees to about 70 degrees, from about 5 degrees to about 65 degrees, from about 5 degrees to about 60 degrees, from about 5 degrees to about 55 degrees, from about 5 degrees to about 50 degrees, from about 5 degrees to about 45 degrees, from about 5 degrees to about 40 degrees, from about 5 degrees to about 35 degrees, from about 5 degrees to about 30 degrees, from about 5 degrees to about 25 degrees, from about 5 degrees to about 20 degrees, from about 5 degrees to about 15 degrees, and all ranges and sub-ranges therebetween, away from the reference illumination angle. The article may exhibit the angular color shifts in reflectance and/or transmittance described herein at and along all the incident illumination angles in the range from about 2 degrees to about 80 degrees (or from about 10 degrees to about 80 degrees, or from about 20 degrees to about 80 degrees), when the reference illumination angle is near-normal incidence, wherein "near-normal incidence" is within 10° of normal incidence. In some embodiments, the article may exhibit the angular color shifts in reflectance and/or transmittance described herein at and along all the incident illumination angles in the range from about 2 degrees to about 80 degrees (or from about 10 degrees to about 80 degrees, or from about 20 degrees to about 80 degrees), when the difference between the incident illumination angle and the reference illumination angle is at least about 5 degrees, or about 10 degrees, or about 15 degrees, or about 20 degrees. In one example, the article may exhibit an angular color shift in reflectance and/or transmittance of 5 or less (e.g., 4 or less, 3 or less or about 2 or less) at any incident illumination angle in the range from about 2 degrees to about 60 degrees, from about 5 degrees to about 60 degrees, or from about 10 degrees to about 60 degrees away from a reference illumination angle equal to normal incidence. In other examples, the article may exhibit an angular color shift in reflectance and/or transmittance of 5 or less (e.g., 4 or less, 3 or less or about 2 or less) when the reference illumination angle is 10 degrees and the incident illumination angle is any angle in the range from about 12 degrees to about 60 degrees, from about 15 degrees to about 60 degrees, or from about 20 degrees to about 60 degrees away from the reference illumination angle.

In some embodiments, the angular color shift may be measured at all angles between a reference illumination angle (e.g., near-normal incidence) and an incident illumination angle in the range from about 20 degrees to about 80 degrees. In other words, the angular color shift may be measured and may be less than a stated value, at all angles in the range from about 0 degrees and 20 degrees, from about 0 degrees to about 30 degrees, from about 0 degrees to about 40 degrees, from about 0 degrees to about 50 degrees, from about 0 degrees to about 60 degrees or from about 0 degrees to about 80 degrees.

In one or more embodiments, the article exhibits a color in the CIE L*, a*, b* colorimetry system in reflectance and/or transmittance such that the distance or reference point color shift between the transmittance color or reflectance coordinates from a reference point is less than a stated value, under an illuminant (which can include standard illuminants as determined by the CIE, including A illuminants (representing tungsten-filament lighting), B illuminants (daylight simulating illuminants), C illuminants (daylight simulating illuminants), D series illuminants (representing natural daylight), and F series illuminants (representing various types of fluorescent lighting)). Unless otherwise noted, the transmittance color or transmittance color coordinates are measured on two surfaces of the article including at the appearance-enhancing surface 122 and the opposite bare surface of the article (i.e., 114). Unless otherwise noted, the reflectance, reflectance color or reflectance color coordinates are measured only from the appearance-enhancing surface 122 of the article. More specifically, when measuring reflectance, reflectance color, or reflectance color coordinates: the instrumentation is disposed on the side of the article that includes the appearance-enhancing surface 122; light is incident from the same side as the instrumentation; the side of the article opposite that on which the instrumentation is disposed (back side) is immersed in air; no measures are taken to index-match the back side of the article to remove reflected light from the back-side/air interface; and the instrumentation measures the light reflected from the coated article.

In one or more embodiments, the reference point may be the origin (0, 0) in the CIE L*, a*, b* colorimetry system (or the color coordinates a*=0, b*=0), the coordinates (a*=−2, b*=−2), or the transmittance or reflectance color coordinates of the substrate. It should be understood that unless otherwise noted, the L* coordinate of the articles described herein are the same as the reference point and do not influence color shift. Where the reference point color shift of the article is defined with respect to the substrate, the transmittance color coordinates of the article are compared to the transmittance color coordinates of the substrate and the reflectance color coordinates of the article are compared to the reflectance color coordinates of the substrate.

Where the reference point is the color coordinates a*=0, b*=0, the reference point color shift is calculated by Equation (2).

reference point color shift=√((a*$_{article}$)$^2$+(b*$_{article}$)$^2$)    (2)

Where the reference point is the color coordinates a*=−2, b*=−2, the reference point color shift is calculated by Equation (3).

reference point color shift=√((a*$_{article}$+2)$^2$+(b*$_{article}$+2)$^2$)    (3)

Where the reference point is the color coordinates of the substrate, the reference point color shift is calculated by Equation (4).

reference point color shift=√((a*$_{article}$−a*$_{substrate}$)$^2$+(b*$_{article}$−b*$_{substrate}$)$^2$)    (4)

The article of one or more embodiments, or the appearance-enhancing surface 122 of one or more articles, may exhibit an average light transmittance over the optical wavelength regime in the range from about 400 nm to about 800 nm. In some embodiments, the article, or the appearance-enhancing surface 122 of one or more articles, may exhibit an average light reflectance over the optical wavelength regime in the range from about 400 nm to about 800 nm. These light transmittance and light reflectance values may be observed over the entire optical wavelength regime or over selected ranges of the optical wavelength regime (e.g., a 100 nm wavelength range, 150 nm wavelength range, a 200 nm wavelength range, a 250 nm wavelength range, a 280 nm wavelength range, or a 300 nm wavelength range, within the optical wavelength regime). light reflectance and transmittance values may be a total reflectance (including specular and diffuse components) or total transmittance (including specular and diffuse components). Unless otherwise specified, the average reflectance or transmittance is measured at an incident illumination angle in the range from about 0 degrees to about 10 degrees (however, such measurements may be provided at incident illumination angles of 45 degrees or 60 degrees).

In some embodiments, the article of one or more embodiments, or the appearance-enhancing surface 122 of one or more articles, may exhibit an average visible photopic reflectance over the optical wavelength regime. In other embodiments, the article of one or more embodiments, or the appearance enhancing surface 122 of one or more articles, may exhibit an average visible photopic reflectance. These photopic reflectance values may be exhibited at incident illumination angles in the range from about 0° to about 20°, from about 0° to about 40° or from about 0° to about 60°. As used herein, photopic reflectance mimics the response of the human eye by weighting the reflectance versus wavelength spectrum according to the human eye's sensitivity. Photopic reflectance may also be defined as the luminance, or tristimulus Y value of reflected light, according to known conventions such as CIE color space conventions. The average photopic reflectance is defined in Equation (5) as the spectral reflectance, R(λ) multiplied by the illuminant spectrum, I(λ) and the CIE's color matching function ȳ(λ), related to the eye's spectral response, integrated as λ varies from 380 nm to 720 nm:

$$\langle R_p \rangle = \int_{380\,nm}^{720\,nm} R(\lambda) \times I(\lambda) \times \bar{y}(\lambda) d\lambda \quad (5)$$

Opaque, translucent, and colored glass-ceramics have been developed, for example those described in U.S. Pat. No. 9,115,023, "Colored and opaque glass-ceramic(s), associated colorable and ceramable glass(es), and associated process(es)", U.S. Pat. No. 9,403,716 "Glass-ceramic(s); Associated Formable and/or Color-Tunable, Crystallizable Glass(es); and Associated Process(es)", U.S. Pat. No. 9,133,054 "White, Opaque, β-Spodumene/Rutile Glass-Ceramic Articles and Methods for Making the Same", and US published patent application 20150239772, "Low Crystallinity Glass-Ceramics", the contents of each of which are hereby incorporated by reference. The substrate 110 may be formed from man-made materials and/or naturally occurring materials.

Substrate

Suitable substrates 110 may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In one or more embodiments, the substrate 110 may include crystalline substrates such as glass-ceramic substrates (which may be strengthened or non-strengthened) or may include a single crystal structure, such as sapphire.

The substrate 110 of one or more embodiments may have a hardness that is less than the hardness of the article (as measured by the Berkovich Indenter Hardness Test described herein). The hardness of the substrate may be measured using known methods in the art, including but not limited to the Berkovich Indenter Hardness Test or Vickers hardness test.

The substrate 110 may be substantially planar or sheet-like, although other embodiments may utilize a curved or otherwise shaped or sculpted substrate. In one or more alternative embodiments, the substrate 110 may be opaque, translucent, or colored. The substrate 110 may optionally exhibit a color, such as white, black, red, blue, green, yellow, orange, etc.

Additionally or alternatively, the physical thickness of the substrate 110 may vary along one or more of its dimensions for aesthetic and/or functional reasons. For example, the edges of the substrate 110 may be thicker as compared to more central regions of the substrate 110. The length, width and physical thickness dimensions of the substrate 110 may also vary according to the application or use of the article 100.

The substrate 110 may be provided using a variety of different processes. For instance, various forming methods can include float glass processes, rolling methods, updraw processes, and down-draw processes such as fusion draw and slot draw.

Once formed, a substrate 110 may be strengthened to form a strengthened substrate. As used herein, the term "strengthened substrate" may refer to a substrate that has been chemically strengthened, for example through ion-exchange of larger ions for smaller ions in the surface of the substrate. However, other strengthening methods known in the art, such as thermal tempering, or utilizing a mismatch of the coefficient of thermal expansion between portions of the substrate to create compressive stress and central tension regions, may be utilized to form strengthened substrates.

Where the substrate is chemically strengthened by an ion exchange process, the ions in the surface layer of the substrate are replaced by—or exchanged with—larger ions having the same valence or oxidation state. Ion exchange processes are typically carried out by immersing a substrate in a molten salt bath containing the larger ions to be exchanged with the smaller ions in the substrate. It will be appreciated by those skilled in the art that parameters for the ion exchange process, including, but not limited to, bath composition and temperature, immersion time, the number of immersions of the substrate in a salt bath (or baths), use of multiple salt baths, additional steps such as annealing, washing, and the like, are generally determined by the composition of the substrate and the desired compressive stress (CS), depth of compressive stress layer (or depth of layer) of the substrate that result from the strengthening operation. By way of example, ion exchange of alkali metal-containing glass substrates may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 40 hours. However, temperatures and immersion times different from those described above may also be used.

In addition, non-limiting examples of ion exchange processes in which glass substrates are immersed in multiple ion exchange baths, with washing and/or annealing steps between immersions, are described in U.S. patent application Ser. No. 12/500,650, filed Jul. 10, 2009, by Douglas C. Allan et al., entitled "Glass with Compressive Surface for Consumer Applications" and claiming priority from U.S. Provisional Patent Application No. 61/079,995, filed Jul. 11, 2008, in which glass substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass substrates are strengthened by ion exchange in a first bath is diluted with an effluent ion, followed by immersion in a second bath having a smaller concentration of the effluent ion than the first bath. The contents of U.S. patent application Ser. No. 12/500,650 and U.S. Pat. No. 8,312,739 are incorporated herein by reference in their entirety.

The degree of chemical strengthening achieved by ion exchange may be quantified based on the parameters of central tension (CT), surface compressive stress (CS), and depth of compression (DOC). Maximum CT values are measured using a scattered light polariscope (SCALP) technique known in the art. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. As used herein, DOC means the depth at which the stress in the chemically strengthened alkali aluminosilicate glass article described herein changes from compressive to tensile. DOC may be measured by FSM or a scattered light polariscope (SCALP) depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

In one embodiment, a strengthened substrate 110 can have a surface CS of 250 MPa or greater, 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened substrate may have a DOL of 10 µm or greater, 15 µm or greater, 20 µm or greater (e.g., 25 µm, 30 µm, 35 µm, 40 µm, 45 µm, 50 µm or greater) and/or a CT of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened substrate has one or more of the following: a surface CS greater than 500 MPa, a DOL greater than 15 µm, and a CT greater than 18 MPa.

The substrate 110 may include a glass ceramic substrate, which may be strengthened or non-strengthened. Examples of suitable glass ceramics may include $Li_2O$—$Al_2O_3$—$SiO_2$ system (i.e. LAS-System) glass ceramics, MgO—$Al_2O_3$—$SiO_2$ system (i.e. MAS-System) glass ceramics, and/or glass ceramics that include a predominant crystal phase including β-quartz solid solution, β-spodumene ss, cordierite, and lithium disilicate. The glass ceramic substrates may be strengthened using the chemical strengthening processes disclosed herein. In one or more embodiments, MAS-System glass ceramic substrates may be strengthened in $Li_2SO_4$ molten salt, whereby an exchange of $2Li^+$ for $Mg^{2+}$ can occur.

The substrate 110 according to one or more embodiments can have a physical thickness ranging from about 100 µm to about 5 mm. Example substrate 110 physical thicknesses range from about 100 µm to about 500 µm (e.g., 100, 200, 300, 400 or 500 µm). Further example substrate 110 physical thicknesses range from about 500 µm to about 1000 µm (e.g., 500, 600, 700, 800, 900 or 1000 µm). The substrate 110 may have a physical thickness greater than about 1 mm (e.g., about 2, 3, 4, or 5 mm). In one or more specific embodiments, the substrate 110 may have a physical thickness of 2 mm or less or less than 1 mm. The substrate 110 may be acid polished or otherwise treated to remove or reduce the effect of surface flaws.

Appearance-Enhancing Coating

As shown in FIG. 2, the appearance-enhancing coating 130 may include a plurality of layers such that one or more layers may be disposed on the opposite side of the substrate 110 from the appearance-enhancing coating 130 (i.e., on major surface 114) shown in FIG. 1).

The physical thickness of the appearance-enhancing coating 130 disposed on the major surface 114 may be in the range from about 0.1 µm to about 5 µm. In some instances, the physical thickness of the appearance-enhancing coating 130 disposed on major surface 114 may be in the range from about 0.01 µm to about 0.9 µm, from about 0.01 µm to about 0.8 µm, from about 0.01 µm to about 0.7 µm, from about 0.01 µm to about 0.6 µm, from about 0.01 µm to about 0.5 µm, from about 0.01 µm to about 0.4 µm, from about 0.01 µm to about 0.3 µm, from about 0.01 µm to about 0.2 µm, from about 0.01 µm to about 0.1 µm, from about 0.02 µm to about 1 µm, from about 0.03 µm to about 1 µm, from about 0.04 µm to about 1 µm, from about 0.05 µm to about 1 µm, from about 0.06 µm to about 1 µm, from about 0.07 µm to about 1 µm, from about 0.08 µm to about 1 µm, from about 0.09 µm to about 1 µm, from about 0.2 µm to about 1 µm, from about 0.3 µm to about 5 µm, from about 0.4 µm to about 3 µm, from about 0.5 µm to about 3 µm, from about 0.6 µm to about 2 µm, from about 0.7 µm to about 1 µm, from about 0.8 µm to about 1 µm, or from about 0.9 µm to about 1 µm, and all ranges and sub-ranges therebetween.

Appearance Enhancing Effects

Glass-ceramic substrates combined with designed hardcoatings can exhibit high hardness, high scratch resistance, and desirable optical appearance attributes. In some embodiments, opaque, translucent, or colored glass-ceramic articles include a hardcoated surface in order to enhance the appearance of the article. For example, the hardcoated surface may enhance the deep, rich, color of an article. For example, a black substrate (for example a black glass-ceramic substrate) may have a deeper, richer, black color when coated with an appearance-enhancing coating as described herein. In additional examples, the appearance of a white substrate (for example a white glass-ceramic substrate) may have a brighter appearance. Various combinations of photopic average specular reflectance, photopic average diffuse reflectance, photopic average total reflectance (i.e., specular+ diffuse), photopic average total transmittance, reflected color, and/or transmitted color, lead to enhanced visual appearance of the substrate. Further details of preferred combinations are described below. Desirable optical appearance attributes can be achieved when the reflectance, transmittance, color, and light scattering properties, of both the glass-ceramic substrates and the hardcoatings are well designed and controlled.

Specular, diffuse, and total, photopic reflectance as reported herein were measured using a PerkinElmer Lambda 950 w. 150 mm integrating sphere and an incident light angle of 8 degrees. The definition of diffuse reflectance is light that is scattered and reflected at angles greater than +/−2.5 degrees away from the specular direction. Diffuse reflectance as a percentage of total reflectance can also be called "reflected haze", and diffuse transmittance as a percentage of total transmittance can be called "transmitted haze", according to definitions known in the art. Similarly, specular, diffuse, and total, photopic transmittance as reported herein were measured using a PerkinElmer Lambda 950w. 150 mm integrating sphere and an incident light angle of 8 degrees. For total transmittance, light passes through the sample under test, then into an integrating sphere, which captures all the light transmitted through the sample—this is referred to as the total transmitted light, or total photopic transmittance. To measure the diffuse light transmitted by the sample, a port in the integrating sphere is opened, allowing the specularly transmitted light to escape. This allows the integrating sphere to capture the diffuse transmitted light. The particular transmittance (total, or diffuse) is determined by dividing these signals by measurement of the light incident on the integrating sphere when the sample under test is removed from the beam path. Specular transmittance is then determined from total and diffuse transmittance values.

In some cases, the article may be opaque or translucent and have a variety of colors such as red, orange, yellow, green, blue, deep blue, grey, or purple. In these cases the hardcoating may provide an enhanced apparent color saturation under ambient lighting, due to the lower ambient reflection (which can 'wash out' the apparent color saturation of colored articles).

The hardcoated surface of the hardcoated glass-ceramic article has a high indentation hardness. The Berkovich nanoindentation hardness of the hardcoated surface of the article may be greater than 8 GPa, 10 GPa, 12 GPa, 14 GPa, or 16 GPa. These hardness values may be measured at indentation depths of 100 nm or greater, 250 nm or greater, or 500 nm or greater. The hardness values are measured by the Berkovich Indenter Hardness Test described herein.

Black Glass-Ceramic

Black substrates, particularly glass substrates having a printed black color on the back side, may appear less black, or "washed out" when subject to bright light. Black glass-ceramic substrates allow the light absorption also to occur within the bulk of the substrate (as opposed to only in a thin coating or surface layer on the substrate). Further, the hardcoat may be chosen so that there is reduced diffuse reflection at the surface of the article, i.e., the article is more light absorbing, causing the article to appear as a deeper, richer, black color.

Accordingly, the black-glass ceramic substrate is as described in US published Patent Application 2015/0239772, and is sold as Corning Glass Code #9887 Obsidian, available from Corning Incorporated, Corning, N.Y. The appearance-enhancing coating was designed to reduce the diffuse reflectance at the appearance-enhancing surface. Further, when black articles are scratched, the scratches are very noticeable (particularly when compared with white articles). Thus, the coating was designed to have high scratch resistance to avoid degradation of the enhanced appearance of the substrate. Specifically, the coating was designed as set forth in Examples 2 and 3 below. The measured properties of the coated black glass-ceramic substrate were measured, and are reported in Table 1 below. Comparative Example A was a control sample of a black glass-ceramic substrate without any coating, the substrate was Corning Code #9887 Obsidian and had a physical thickness of 0.5 mm. Comparative Example C was a control sample having a Corning® Gorilla® glass substrate (glass code #2320) available from Corning Incorporated, Corning, N.Y., having a thickness of 0.55 mm, and having printed on its back side a layer of black ink (UV ink LH-100 Black available from Mimaki Global, having offices in Nagano, Japan). The ink was printed onto the b side 9 or back side) of the substrates using a Mimaki ufj7151+ machine, in, 12 passes, with an overprint of 4 (layers of ink) to achieve targeted opacity, resolution of print 600×900 dpi (dots per inch), which was UV cured as it was printed with 100% luminance. Comparative Example D is the substrate of Example C but having a coating according to Example 3 below. Example B, having enhanced black appearance according to the present disclosure, was a black glass-ceramic substrate according to comparative Example A but having a coating according to Example 2 below. Example B had the deepest, richest, black color when compared to each of the comparative Examples A, C, and D. Also, Example B had the lowest photopic average diffuse reflection. Although total transmission is reported, essentially all of the transmission was diffuse.

Figure 10:
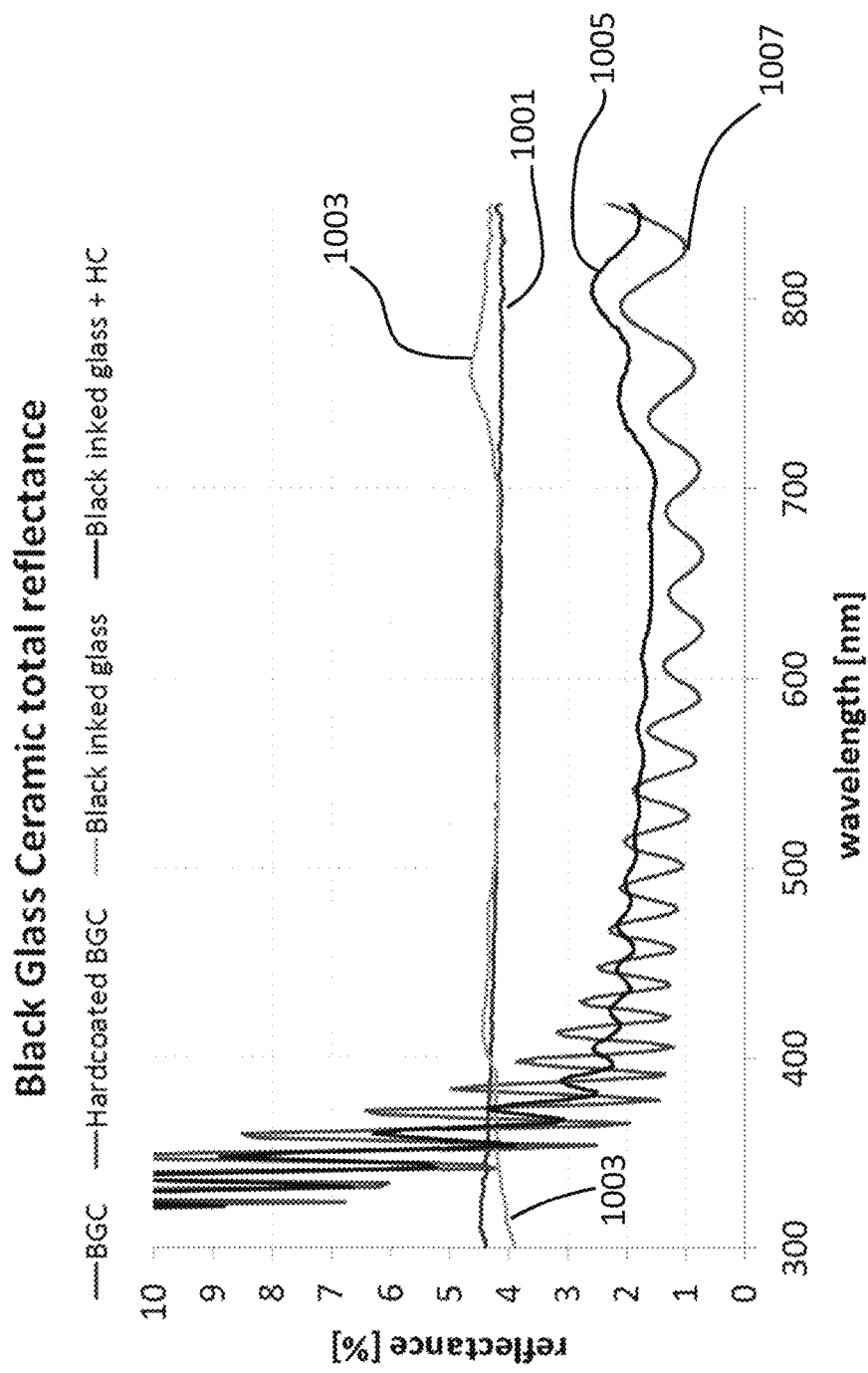
FIG. 10 is a graph showing total reflectance in % versus wavelength in nm, of an article according to one or more embodiments.
Figure 11:
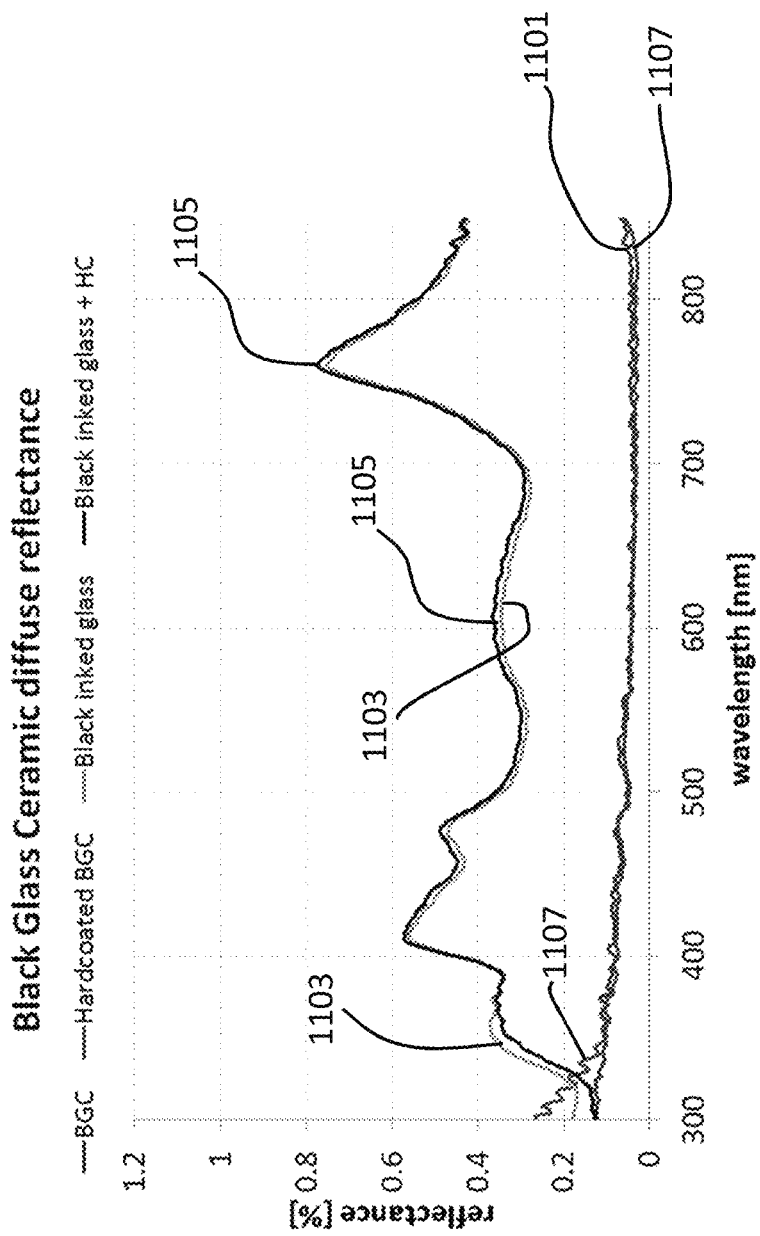
FIG. 11 is a graph showing diffuse reflectance in % versus wavelength in nm, of an article according to one or more embodiments.
Figure 12:
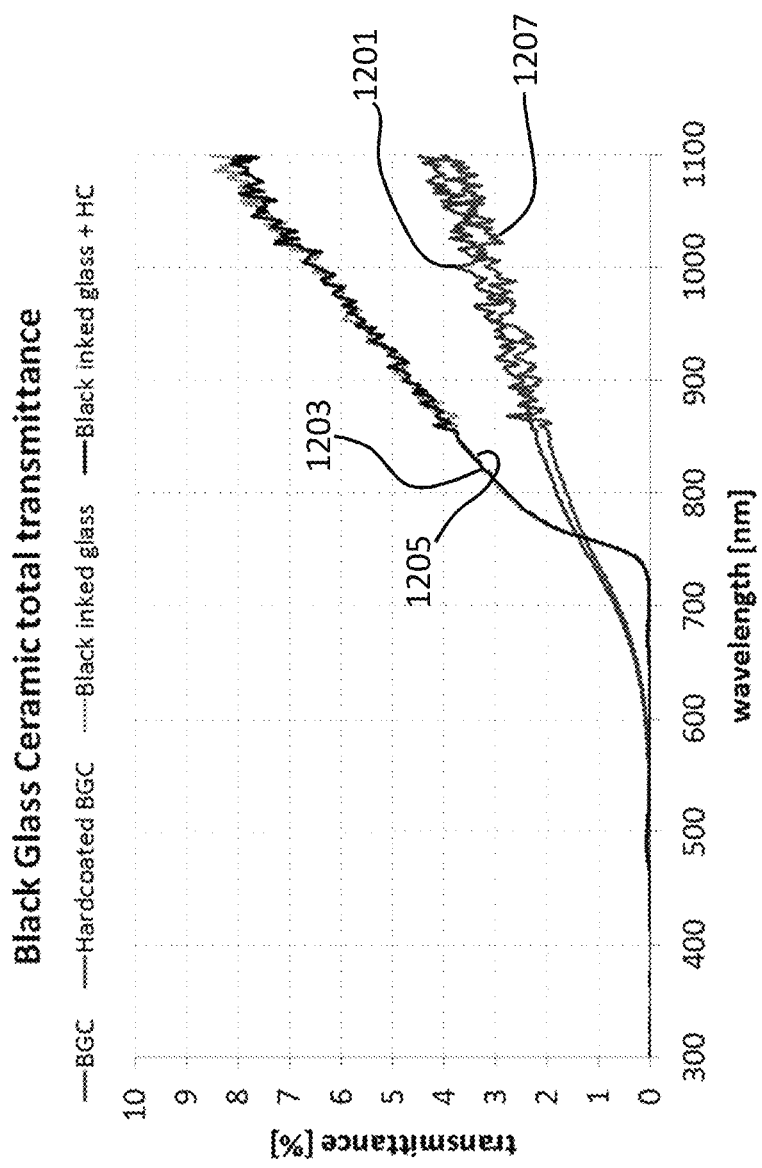
FIG. 12 is a graph showing total transmittance in % versus wavelength in nm, of an article according to one or more embodiments.

FIG. 10 shows total reflectance of a black glass-ceramic substrate in % versus wavelength in nm. In FIG. 10: line 1001 is the plot for Comparative Example A; line 1003 is the plot for Comparative Example C; line 1005 is the plot for Comparative Example D; and line 1007 is the plot for Example B. FIG. 11 shows diffuse reflectance of a black glass-ceramic substrate in % versus wavelength in nm. From this plot, it is seen that the coated black-glass ceramic according to Example B has very little diffuse reflectance in the visible range of wavelengths, wherein such diffuse reflectance would be difficult, if not impossible, for an observer to detect with the naked eye. Such low diffuse reflectance is possible because of the low diffuse reflectance of both the substrate itself and of the coating disposed thereon. These low diffuse reflectances are a function of the microstructure of the substrate and coating, particularly crystallite sizes being smaller than about 50 nm, for example about 40 nm or smaller, or 30 nm or smaller, or 25 nm or smaller, or 10 nm or smaller, or 5 nm or smaller. In FIG. 11: line 1101 is the plot for Comparative Example A; line 1103 is the plot for Comparative Example C; line 1105 is the plot for Comparative Example D; and line 1107 is the plot for Example B. FIG. 12 shows total transmittance of a black glass-ceramic substrate in % versus wavelength in nm. In FIG. 12: line 1201 is the plot for Comparative Example A; line 1203 is the plot for Comparative Example C; line 1205 is the plot for Comparative Example D; and line 1207 is the plot for Example B.

Further characteristics of the coated black-glass ceramic article, which give rise to its deep, rich, black color, are as follows, wherein any particular embodiment may include one or more of the following features in any and all combinations:

In some embodiments, an article may include: a glass-ceramic substrate having a major surface; an optical coating disposed on the major surface and forming an appearance-enhancing surface, the optical coating may include an appearance-enhancing coating, and a scratch-resistant layer, wherein the article comprises a hardness of 8 GPa or more, and a photopic average diffuse light reflectance measured at the appearance-enhancing surface of one of: (i) 0.3% or less;

TABLE 1

Optics of hardcoated black glass ceramic and comparative examples.

| | F2 Illuminant | | | D65 Illuminant | | | | |
| --- | --- | --- | --- | --- | --- | --- | --- | --- |
| Property - Sample | Photopic Average (Y) | a* | b* | Photopic Average (Y) | a* | b* | dE* | dC* |
| Specular Rx - Comp. Ex. A | 4.13 | 0.02 | −0.28 | 4.13 | 0.01 | −0.25 | 24.108 | 0.249 |
| Specular Rx - Example B | 1.25 | −1.47 | −5.44 | 1.29 | −1.28 | −5.37 | 12.517 | 5.523 |
| Specular Rx - Comp. Ex. C | 3.90 | 0.00 | 0.06 | 3.90 | 0.00 | 0.04 | 23.325 | 0.041 |
| Specular Rx - Comp. Ex. D | 1.44 | −0.88 | −1.26 | 1.46 | −1.07 | −1.37 | 12.453 | 1.733 |
| Diffuse Rx - Comp. Ex. A | 0.05 | −0.06 | −0.39 | 0.06 | −0.09 | −0.32 | 0.602 | 0.327 |
| Diffuse Rx - Example B | 0.05 | −0.04 | −0.32 | 0.05 | −0.06 | −0.27 | 0.538 | 0.276 |
| Diffuse Rx - Comp. Ex. C | 0.32 | 0.79 | −2.29 | 0.33 | 0.97 | −2.12 | 3.767 | 2.331 |
| Diffuse Rx - Comp. Ex. D | 0.34 | 0.84 | −2.34 | 0.34 | 1.03 | −2.15 | 3.905 | 2.387 |
| Total Rx - Comp. Ex. A | 4.18 | 0.00 | −0.41 | 4.19 | −0.02 | −0.36 | 24.290 | 0.359 |
| Total Rx - Example B | 1.30 | −1.47 | −5.52 | 1.35 | −1.29 | −5.42 | 12.857 | 5.572 |
| Total Rx - Comp. Ex. C | 4.22 | 0.28 | −0.75 | 4.22 | 0.34 | −0.70 | 24.410 | 0.782 |
| Total Rx - Comp. Ex. D | 1.78 | −0.23 | −2.47 | 1.80 | −0.28 | −2.45 | 14.604 | 2.462 |
| Total Tx - Comp. Ex. A | 0.06 | 0.78 | 0.98 | 0.05 | 1.24 | 0.91 | 1.613 | 1.541 |
| Total Tx - Example B | 0.05 | 0.70 | 0.86 | 0.05 | 1.12 | 0.80 | 1.437 | 1.377 |
| Total Tx - Comp. Ex. C | 0.02 | −0.27 | −0.01 | 0.02 | −0.47 | 0.08 | 0.519 | 0.472 |
| Total Tx - Comp. Ex. D | 0.02 | −0.26 | −0.01 | 0.02 | −0.44 | 0.06 | 0.491 | 0.447 |

Rx = reflectance,
Tx = transmittance.

(ii) 0.2% or less; (iii) 0.1% or less, and all ranges and sub-ranges between the foregoing values, over an optical wavelength regime in the range from about 400 nm to about 800 nm.

In some embodiments, an article may include: a glass-ceramic substrate having a major surface; an optical coating disposed on the major surface and forming an appearance-enhancing surface, the optical coating comprising an appearance-enhancing coating, and a scratch-resistant layer. The article comprises a hardness of 8 GPa or more. In the (L*, a*, b*) colorimetry system of the International Commission on Illumination, at near-normal incidence, the article may include a diffuse reflectance dE* of one of: (i) 3 or less; (ii) 2 or less; or (iii) 1 or less, and all ranges and sub-ranges between the foregoing values, where dE* is defined as $dE^*=sqrt(L^{*2}+a^{*2}+b^{*2})$.

The article may exhibit a photopic average diffuse light reflectance measured at the appearance-enhancing surface of one of (i) 0.3% or less; (ii) 0.2% or less; (iii) 0.1% or less, and all ranges and sub-ranges between the foregoing values, over an optical wavelength regime in the range from about 400 nm to about 800 nm.

The appearance-enhancing surface of the article may include a photopic average total reflectance of one of: (i) less than 4%; (ii) less than 3%; (iii) less than 2%; (iv) less than 1.5%.

The appearance-enhancing surface may have at least one of a total, a specular, and a diffuse reflected color, at near-normal incidence within a range of 0 to −8 in both a* and b*.

At least one of total reflected color and specular reflected color may be at least one of: (i) b* less than 0; (ii) b* from 0 to −10; and (iii) a* from 0 to −2.

The diffuse reflected color may be at least one of: (i) b* less than zero; (ii) b* from 0 to −2; (iii) b* from 0 to −1; and (iv) a* from −0.5 to 0.5.

In the (L*, a*, b*) colorimetry system of the International Commission on Illumination, the color coordinate shift may be less than 4 in (a*, b*) color space when comparing the near-normal incidence color of the article to the color measured at an angle, or at all angles, between 20 and 60 degrees, where the color shift is defined as $dC^*=sqrt((a_t^*-a^*)^2+(b_t^*-b^*)^2)$ and $a_t^*$ and $b_t^*$ are the target colors coordinates and a* and b* are the color coordinates of the article.

In the (L*, a*, b*) colorimetry system of the International Commission on Illumination, at near-normal incidence, the article may include a dC* of one of: (i) 1 or less; or (ii) 0.5 or less, wherein $dC^*=sqrt(a^{*2}+b^{*2})$.

The ceramic portion of the glass-ceramic may include one of: (i) less than about 20%; or (ii) less than about 10%, crystalline material. The ceramic component of the glass-ceramic may include Fe2O3, TiO2, or MgO crystallites. The crystallites may have an average size from about 5 nm to about 50 nm, and a cross-sectional area fraction of less than about 15% of the overall cross-sectional area of the glass-ceramic substrate.

The article may exhibit a photopic average total light transmittance of one of: (i) 10% or less; (ii) 5% or less; (iii) 1% or less; or (iv) 0.1% or less, and all ranges and sub-ranges between the foregoing values, over an optical wavelength regime in the range from about 400 nm to about 800 nm.

The article may exhibit a maximum hardness of one of: (i) about 10 GPa or more; (ii) about 12 GPa or more; (iii) about 14 GPa or more; or (iv) about 16 GPa or more, and all ranges and sub-ranges between the foregoing values, as measured on the appearance-enhancing surface by a Berkovich Indenter Hardness Test along an indentation depth of about 100 nm.

The article may exhibits a hardness of about 10 GPa or greater at an indentation depth of about 100 nm and a hardness of about 16 GPa or greater at an indentation depth of about 500 nm as measured on the appearance-enhancing surface by a Berkovich Indenter Hardness Test.

The article may exhibits an abrasion resistance after a 500-cycle abrasion using a Taber Test on the appearance-enhancing surface, wherein after abrasion the appearance-enhancing surface exhibits an average roughness Ra, as measured by atomic force microscopy, of about 12 nm or less.

The appearance-enhancing coating may include a plurality of layers, wherein the plurality of layers may include a first low RI layer, a second high RI layer, and an optional third layer, and further wherein the appearance-enhancing coating may include a plurality of periods such that the first low RI layer and the second high RI layer alternate.

The appearance-enhancing coating may include a first portion and a second portion, and the scratch resistant layer may be disposed between the first portion and the second portion.

The optical coating includes a thickness and may include a plurality of layers comprising a nitride or oxy-nitride material, where the combined thickness of the layers comprising a nitride or an oxyinitride may be 50% or greater of the thickness of the optical coating.

The scratch resistant layer may be a high RI layer, and may be the thickest layer in the appearance-enhancing coating. The scratch resistant layer may have a thickness in the range from about 0.5 micrometer to about 3 micrometers. The layers positioned over the scratch resistant layer may have a total thickness of less than or equal to about 200 nm. The scratch resistant layer may include a high RI material, and one or more of the layers positioned over the scratch resistant layer may include a high RI material, and another one or more of the layers positioned over the scratch resistant layer may include a low RI material.

The uppermost 500 nm of the optical coating measured from the appearance-enhancing surface comprises at least one of: less than about 30% of low RI material; and at least about 70% of high RI material.

White Glass-Ceramic

A white-glass ceramic substrate is as generally described in U.S. Pat. No. 9,133,054, and particularly Corning® glass code #9667GC, or glass code #5318GC, available from Corning Incorporated, Corning N.Y. The appearance-enhancing coating was designed to enhance the total reflectance at the appearance-enhancing surface in an attempt to make the substrate appear brighter. As noted above, when white articles are scratched, the scratches are not so noticeable. Thus, the coating need not have a high scratch resistance to avoid degradation of the enhanced appearance of the substrate. Thus, the coating may be designed as set forth in either Examples 1-3 below or as in Examples 4-5. Comparatively speaking, the coating of Examples 4-5 is designed to have a higher reflectance than that of Examples 1-3. The measured properties of the coated white glass-ceramic substrate were measured, and are reported in Table 2 below. Comparative Example E is a control sample of a white glass-ceramic substrate without any coating, the substrate being glass code #9667GC and having a thickness 0.7 mm. Comparative Example H was a control sample of a glass substrate the same as described in connection with comparative Examples B and C described above, having printed (in the same manner as for comparative Example C) on its back side a layer of white (instead of black) ink (UV ink LH-100 white) available from Mimaki Global, Nagano, Japan. Comparative Example I is the substrate of comparative Example H but having a coating according to Example 3 below. Example F, according to the concepts of the present disclosure, was a white glass-ceramic substrate according to comparative Example E but having a coating according to Example 4 below. Example G, according to the concepts of the present disclosure, was a white glass-ceramic substrate according to comparative Example E but having a coating according to Example 3 below. Example F had the highest total reflection when compared to each of the comparative Examples H and I, and when compared to Example G. Also, Example F had a total reflection similar to that of Comparative Example E, but also included a scratch resistant layer. In some embodiments, a scratch resistant layer may be useful even on a white glass-ceramic substrate to enhance durability. Although total transmission is reported, essentially all of the transmission was diffuse. It is interesting to note that the total transmission of comparative Examples H and I were the highest. Accordingly, in embodiments wherein it is beneficial to block light transmission, the substrates of Examples F and G may be useful to do so while still producing a desirable reflection in an attempt to make the substrate appear brighter.

one of: (i) 75% or more; or (ii) 80% or more, and all ranges and sub-ranges between the foregoing values, over an optical wavelength regime in the range from about 400 nm to about 800 nm.

A specular reflectance of one of: (i) 2% or more; (ii) 4% or more; (iii) 5% or more; (iv) 6% or more; (v) 7% or more; (vi) 8% or more; (vii) 9% or more; (viii) 10% or more, and all ranges and sub-ranges between the foregoing values.

In the (L*, a*, b*) colorimetry system of the International Commission on Illumination, the total reflectance may include reflected color coordinates a* and b* that are each one of: (i) less than 0; or (ii) from 0 to −4, for all viewing angles from 0 to 60 degrees.

In the (L*, a*, b*) colorimetry system of the International Commission on Illumination, the diffuse and/or total reflected color may be at least one of: (i) b*<0; (ii) b* from −0.5 to −2; and (iii) a* from 0 to −2.

The total photopic average transmittance may be one of: (i) 10% or less; (ii) 8% or less; (iii) 6% or less; (iv) 5% or less; (v) 4% or less; (vi) 3% or less; (vii) 2% or less, and all ranges and sub-ranges between the foregoing values.

The article may exhibit a maximum hardness of one of: (i) about 10 GPa or more; (ii) about 12 GPa or more; (iii) about 14 GPa or more; or (iv) about 16 GPa or more, and all ranges and sub-ranges between the foregoing values, as measured on the appearance-enhancing surface by a Berkovich Indenter Hardness Test along an indentation depth of about 100 nm.

TABLE 2

Optics of hardcoated white glass ceramic and comparative examples.

| | F2 Illuminant | | | D65 Illuminant | | | | |
|---|---|---|---|---|---|---|---|---|
| Property - Sample | Photopic Average (Y) | a* | b* | Photopic Average (Y) | a* | b* | dE* | dC* |
| Specular Rx - Comp. Ex. E | 4.10 | −1.22 | 5.66 | 4.08 | −1.69 | 4.99 | 24.496 | 5.268 |
| Specular Rx - Example F | 10.05 | −0.88 | 0.82 | 10.05 | −0.80 | 0.79 | 37.946 | 1.118 |
| Specular Rx - Example G | 0.94 | −2.06 | 15.73 | 0.92 | −3.17 | 14.47 | 16.967 | 14.818 |
| Specular Rx - Comp. Ex. H | 3.83 | −1.08 | 5.54 | 3.81 | −1.42 | 4.80 | 23.560 | 5.006 |
| Specular Rx - Comp. Ex. I | 1.33 | −3.08 | 9.96 | 1.33 | −4.00 | 8.31 | 14.721 | 9.222 |
| Diffuse Rx - Comp. Ex. E | 78.11 | −0.65 | −2.67 | 78.52 | −1.04 | −2.24 | 9.316 | 2.469 |
| Diffuse Rx - Example F | 71.77 | −0.72 | −1.83 | 72.12 | −1.22 | −1.51 | 12.129 | 1.943 |
| Diffuse Rx - Example G | 80.07 | −0.89 | −1.81 | 80.43 | −1.36 | −1.50 | 8.369 | 2.023 |
| Diffuse Rx - Comp. Ex. H | 70.11 | 0.09 | −0.38 | 70.28 | −0.25 | −0.15 | 12.870 | 0.293 |
| Diffuse Rx - Comp. Ex. I | 71.73 | 0.09 | 1.30 | 71.76 | −0.25 | 1.32 | 12.222 | 1.340 |
| Total Rx - Comp. Ex. E | 82.21 | −0.79 | −1.90 | 82.60 | −1.23 | −1.56 | 7.432 | 1.983 |
| Total Rx - Example F | 81.82 | −0.87 | −1.48 | 82.17 | −1.32 | −1.20 | 7.562 | 1.779 |
| Total Rx - Example G | 81.01 | −0.98 | −1.03 | 81.35 | −1.51 | −0.78 | 7.898 | 1.699 |
| Total Rx - Comp. Ex. H | 73.94 | −0.06 | 0.34 | 74.09 | −0.44 | 0.47 | 11.056 | 0.644 |
| Total Rx - Comp. Ex. I | 73.06 | −0.12 | 1.87 | 73.08 | −0.51 | 1.80 | 11.662 | 1.867 |
| Total Tx - Comp. Ex. E | 0.86 | −0.02 | −0.29 | 0.86 | −0.02 | −0.25 | 7.781 | 0.253 |
| Total Tx - Example F | 0.97 | 7.92 | 14.34 | 0.87 | 12.21 | 12.72 | 19.305 | 17.628 |
| Total Tx - Example G | 1.01 | 7.97 | 14.86 | 0.91 | 12.31 | 13.21 | 19.823 | 18.057 |
| Total Tx - Comp. Ex. H | 14.65 | 2.91 | 10.51 | 14.30 | 3.81 | 9.46 | 45.814 | 10.195 |
| Total Tx - Comp. Ex. I | 14.08 | 3.03 | 11.13 | 13.73 | 3.99 | 9.99 | 45.142 | 10.760 |

Rx = reflectance,
Tx = transmittance.

Further characteristics of the coated white-glass ceramic article, which give rise to its high total reflectance, are as follows, wherein any particular embodiment may include one or more of the following features in any and all combinations:

In some embodiments, an article may include: a glass-ceramic substrate having a major surface; an optical coating disposed on the major surface and forming an appearance-enhancing surface, the optical coating including an appearance-enhancing coating; the article comprises a hardness of 8 GPa or more, and exhibits a total photopic average reflectance measured at the appearance-enhancing surface of The article may exhibits a hardness of about 10 GPa or greater at an indentation depth of about 100 nm and a hardness of about 16 GPa or greater at an indentation depth of about 500 nm as measured on the appearance-enhancing surface by a Berkovich Indenter Hardness Test.

The article may exhibits an abrasion resistance after a 500-cycle abrasion using a Taber Test on the appearance-enhancing surface, wherein after abrasion the appearance-enhancing surface exhibits an average roughness Ra, as measured by atomic force microscopy, of about 12 nm or less.

The appearance-enhancing coating may include a plurality of layers, wherein the plurality of layers may include a first low RI layer, a second high RI layer, and an optional third layer, and further wherein the appearance-enhancing coating may include a plurality of periods such that the first low RI layer and the second high RI layer alternate.

The appearance-enhancing coating may include a first portion and a second portion, and the scratch resistant layer may be disposed between the first portion and the second portion.

The optical coating includes a thickness and may include a plurality of layers comprising a nitride or oxy-nitride material, where the combined thickness of the layers comprising a nitride or an oxyinitride may be 50% or greater of the thickness of the optical coating.

The scratch resistant layer may be a high RI layer, and may be the thickest layer in the appearance-enhancing coating. The scratch resistant layer may have a thickness in the range from about 0.5 micrometer to about 3 microm- Translucent Glass-Ceramic A translucent glass-ceramic substrates are described in U.S. Pat. No. 9,403,716. The coating may be designed as set forth in either Examples 1-3 below or as in Examples 4-5. Again, comparatively speaking, the coating of Examples 4-5 was designed to have a higher reflectance than that of Examples 1-3. The properties of the coated translucent glass-ceramic substrate were measured, and are reported in Table 3 below. Comparative Example J is a control sample of a translucent glass-ceramic substrate without any coating, the substrate being of the type generally described as translucent in U.S. Pat. No. 9,403,716 and having a thickness of about 0.5 mm. Example K, according to the concepts of the present disclosure, was a translucent glass-ceramic substrate according to comparative Example J but having a coating according to Example 3 below. Example L, according to the concepts of the present disclosure, was a translucent glass-ceramic substrate according to comparative Example J but having a coating according to Example 4 below. In some embodiments, a scratch resistant layer may be useful on a translucent glass-ceramic substrate to enhance durability.

TABLE 3

Optics of hardcoated translucent glass-ceramic and comparative examples.

| | F2 Illuminant | | | D65 Illuminant | | | | |
|---|---|---|---|---|---|---|---|---|
| Property - Sample | Photopic Average (Y) | a* | b* | Photopic Average (Y) | a* | b* | dE* | dC* |
| Specular Rx - Comp. Ex. J | 6.16 | 0.62 | 4.75 | 6.07 | 0.95 | 4.16 | 70.548 | 4.266 |
| Specular Rx - Example K | 3.81 | 0.41 | 6.66 | 3.71 | 0.86 | 5.66 | 77.527 | 5.724 |
| Specular Rx - Example L | 11.54 | 0.16 | 5.11 | 11.41 | 0.34 | 4.30 | 59.899 | 4.312 |
| Diffuse Rx - Comp. Ex. J | 16.36 | −1.92 | −29.42 | 17.79 | −2.90 | −25.31 | 56.796 | 25.479 |
| Diffuse Rx - Example K | 14.07 | −1.62 | −30.46 | 15.41 | −2.50 | −26.17 | 59.887 | 26.291 |
| Diffuse Rx - Example L | 9.73 | −0.57 | −30.86 | 10.78 | −1.02 | −26.51 | 66.334 | 26.526 |
| Total Rx - Comp. Ex. J | 22.53 | −1.28 | −23.87 | 23.86 | −1.99 | −20.64 | 48.693 | 20.738 |
| Total Rx - Example K | 17.88 | −1.23 | −25.79 | 19.12 | −1.87 | −22.31 | 55.540 | 22.389 |
| Total Rx - Example L | 21.27 | −0.23 | −18.81 | 22.18 | −0.41 | −16.40 | 48.632 | 16.409 |
| Specular Tx - Comp. Ex. J | 0.81 | −0.29 | 1.50 | 0.80 | −0.38 | 1.41 | 92.767 | 1.459 |
| Specular Tx - Example K | 0.84 | −0.32 | 1.50 | 0.84 | −0.41 | 1.35 | 7.708 | 1.415 |
| Specular Tx - Example L | 0.79 | −0.28 | 0.85 | 0.79 | −0.39 | 0.80 | 92.859 | 0.887 |
| Diffuse Tx - Comp. Ex. J | 75.14 | 0.07 | 17.15 | 73.64 | 0.20 | 15.04 | 18.780 | 15.037 |
| Diffuse Tx - Example K | 78.12 | −0.10 | 16.77 | 76.66 | −0.08 | 14.73 | 91.361 | 14.726 |
| Diffuse Tx - Example L | 75.20 | −0.43 | 13.41 | 74.11 | −0.58 | 11.80 | 16.157 | 11.810 |
| Total Tx - Comp. Ex. J | 75.94 | 0.05 | 17.10 | 74.44 | 0.17 | 15.00 | 18.526 | 15.000 |
| Total Tx - Example K | 78.96 | −0.12 | 16.73 | 77.50 | −0.10 | 14.69 | 91.735 | 14.686 |
| Total Tx - Example L | 75.99 | −0.44 | 13.36 | 74.90 | −0.60 | 11.75 | 15.873 | 11.766 |

Rx = reflectance,
Tx = transmittance.

eters. The layers positioned over the scratch resistant layer may have a total thickness of less than or equal to about 200 nm. The scratch resistant layer may include a high RI material, and one or more of the layers positioned over the scratch resistant layer may include a high RI material, and another one or more of the layers positioned over the scratch resistant layer may include a low RI material.

The uppermost 500 nm of the optical coating measured from the appearance-enhancing surface comprises at least one of: less than about 30% of low RI material; and at least about 70% of high RI material.

A device may include: a housing having front, back, and side surfaces; electrical components that are at least partially inside the housing; a display at or adjacent to the front surface of the housing; and a cover substrate disposed over the display, wherein at least a portion of the housing comprises the white glass-ceramic article including any of the above-described features.

Further characteristics of the coated translucent glass-ceramic article, are as follows, wherein any particular embodiment may include one or more of the following features in any and all combinations:

In some embodiments, an article may include: a glass-ceramic substrate having a major surface; an optical coating disposed on the major surface and forming an appearance-enhancing surface, the optical coating including an appearance-enhancing coating; the article comprises a hardness of 8 GPa or more, and exhibits a total photopic average transmittance measured at the appearance-enhancing surface of one of: (i) from 20% to 85%, and all ranges and sub-ranges between the foregoing values; or (ii) from 60% to 85%, and all ranges and sub-ranges between the foregoing values, over an optical wavelength regime in the range from about 400 nm to about 800 nm.

A diffuse specular transmittance may be 90% or more of the total transmittance.

A specular photopic average transmittance may be one of (i) 10% or less; (ii) 8% or less; (iii) 6% or less; (iv) 5% or less; (v) 4% or less; (vi) 3% or less; (vii) 2% or less; or (viii) 1% or less, and all ranges and sub-ranges between the foregoing values.

A total photopic average reflectance may be one of: (i) from 5% to 50%, and all ranges and sub-ranges between the foregoing values; and (ii) from 15% to 30%, and all ranges and sub-ranges between the foregoing values.

A specular photopic average reflectance may be one of: (i) 12% or less; (ii) 10% or less; (iii) 8% or less; (iv) 6% or less; (v) 5% or less; or less; and (vi) 4% or less, and all ranges and sub-ranges between the foregoing values.

In the (L*, a*, b*) colorimetry system of the International Commission on Illumination, the diffuse and/or total reflected color coordinates a* and b* may be at least one of: (i) b*<0; (ii) b* from −10 to −50; and (iii) a* from −5 to 5.

In the (L*, a*, b*) colorimetry system of the International Commission on Illumination, the diffuse and/or total transmitted color may be one of: (i) b*>0; (ii) b* from 0 to 20; and (iii) a* from −2 to 2.

The article may exhibit a maximum hardness of one of: (i) about 10 GPa or more; (ii) about 12 GPa or more; (iii) about 14 GPa or more; or (iv) about 16 GPa or more, and all ranges and sub-ranges between the foregoing values, as measured on the appearance-enhancing surface by a Berkovich Indenter Hardness Test along an indentation depth of about 100 nm.

The article may exhibits a hardness of about 10 GPa or greater at an indentation depth of about 100 nm and a hardness of about 16 GPa or greater at an indentation depth of about 500 nm as measured on the appearance-enhancing surface by a Berkovich Indenter Hardness Test.

The article may exhibits an abrasion resistance after a 500-cycle abrasion using a Taber Test on the appearance-enhancing surface, wherein after abrasion the appearance-enhancing surface exhibits an average roughness Ra, as measured by atomic force microscopy, of about 12 nm or less.

The appearance-enhancing coating may include a plurality of layers, wherein the plurality of layers may include a first low RI layer, a second high RI layer, and an optional third layer, and further wherein the appearance-enhancing coating may include a plurality of periods such that the first low RI layer and the second high RI layer alternate.

The appearance-enhancing coating may include a first portion and a second portion, and the scratch resistant layer may be disposed between the first portion and the second portion.

The optical coating includes a thickness and may include a plurality of layers comprising a nitride or oxy-nitride material, where the combined thickness of the layers comprising a nitride or an oxyinitride may be 50% or greater of the thickness of the optical coating.

The scratch resistant layer may be a high RI layer, and may be the thickest layer in the appearance-enhancing coating. The scratch resistant layer may have a thickness in the range from about 0.5 micrometer to about 3 micrometers. The layers positioned over the scratch resistant layer may have a total thickness of less than or equal to about 200 nm. The scratch resistant layer may include a high RI material, and one or more of the layers positioned over the scratch resistant layer may include a high RI material, and another one or more of the layers positioned over the scratch resistant layer may include a low RI material.

The uppermost 500 nm of the optical coating measured from the appearance-enhancing surface comprises at least one of less than about 30% of low RI material; and at least about 70% of high RI material.

A device may include: a housing having front, back, and side surfaces; electrical components that are at least partially inside the housing; a display at or adjacent to the front surface of the housing; and a cover substrate disposed over the display, wherein at least a portion of the housing comprises the white glass-ceramic article including any of the above-described features.

Uses of the Articles

Figure 13B:
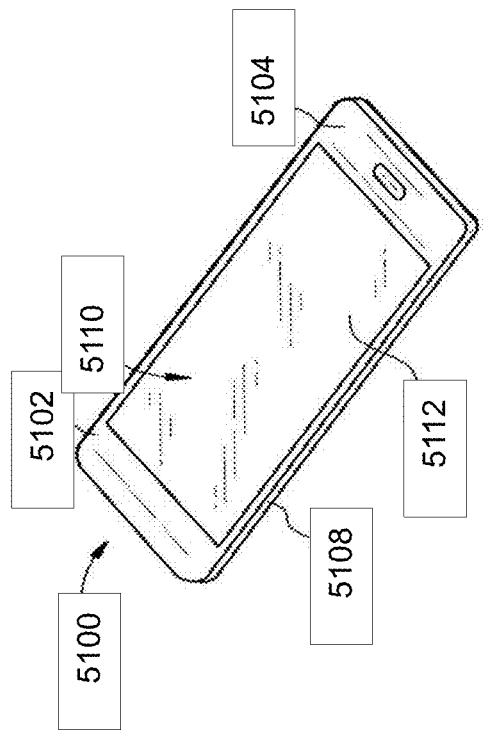
FIG. 13B is a perspective view of the exemplary electronic device of FIG. 13A.
Figure 13A:
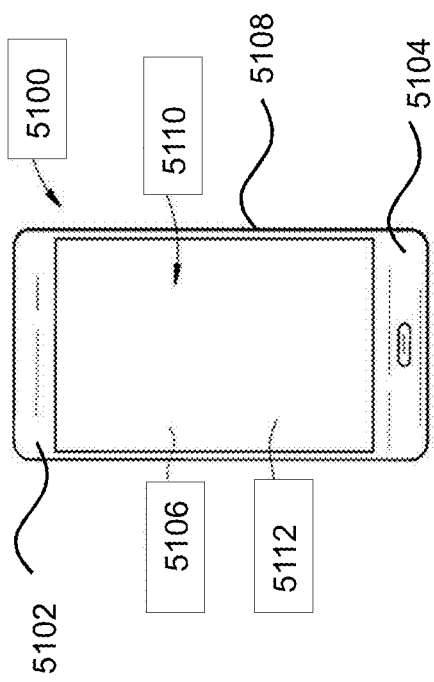
FIG. 13A is a plan view of an exemplary electronic device incorporating any of the articles disclosed herein.

The articles 100 disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that may benefit from some transparency, scratch-resistance, abrasion resistance or a combination thereof. An exemplary article incorporating any one of articles 100 is shown in FIGS. 13A and 13B. Specifically, FIGS. 13A and 13B show a consumer electronic device 5100 including a housing 5102 having front 5104, back 5106, and side surfaces 5108; electrical components (not shown) that are at least partially inside or entirely within the housing and including at least a controller, a memory, and a display 5110 at or adjacent to the front surface of the housing; and a cover substrate 5112 at or over the front surface of the housing such that it is over the display. In some embodiments, at least one of the cover substrate 5112 housing 5102, front 5104, back 5106, and side surfaces 5108, may include any one of articles 100 disclosed herein.

Method of Forming

A second aspect of this disclosure pertains to a method for forming the articles described herein. In one embodiment, the method includes providing a substrate having a major surface in a coating chamber, forming a vacuum in the coating chamber, forming a durable optical coating as described herein on the major surface, optionally forming an additional coating comprising at least one of an easy-to-clean coating and a scratch resistant coating, on the optical coating, and removing the substrate from the coating chamber. In one or more embodiments, the optical coating and the additional coating are formed in either the same coating chamber or without breaking vacuum in separate coating chambers.

In one or more embodiments, the method may include loading the substrate on carriers which are then used to move the substrate in and out of different coating chambers, under load lock conditions so that a vacuum is preserved as the substrate is moved.

The optical coating 120 and/or the additional coating 140 may be formed using various deposition methods such as vacuum deposition techniques, for example, chemical vapor deposition (e.g., plasma enhanced chemical vapor deposition (PECVD), low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition. Liquid-based methods may also be used such as spraying, dipping, spin coating, or slot coating (for example, using sol-gel materials). Where vacuum deposition is utilized, inline processes may be used to form the optical coating 120 and/or the additional coating 140 in one deposition run. In some instances, the vacuum deposition can be made by a linear PECVD source.

In some embodiments, the method may include controlling the thickness of the optical coating 120 and/or the additional coating 140 so that it does not vary by more than about 4% along at least about 80% of the area of the appearance-enhancing surface 122 or from the target thickness for each layer at any point along the substrate area. In some embodiments, the thickness of the optical coating 120 and/or the additional coating 140 so that it does not vary by more than about 4% along at least about 95% of the area of the appearance-enhancing surface 122.

EXAMPLES

Various embodiments will be further clarified by the following examples. In the Examples, it should be noted that $AlO_xN_y$ and $Si_uAl_vO_xN_y$ were found to be substantially interchangeable as the high-index material in the modeled examples, with only minor process adjustments necessary to re-create the targeted refractive index dispersion values and layer thickness designs provided, which are apparent to one of ordinary skill in the art. In addition, for each of the examples, an optional capping layer can be added, with a preferred capping layer being a low-friction, hydrophobic, or easy-to-clean coating or surface treatment, such as a diamond-like carbon, silane (e.g. fluorosilane), phosphonate, alkene, or alkyne. In some embodiments, these coatings or surface treatments can be added directly on the top surface of the examples as listed below. In some embodiments, the top-most (air side) layer of the examples as described below can be truncated or reduced in thickness to account for the optical effect of the capping layer, which may comprise a finite thickness of about 0.5-30 nm and an effective refractive index of 1.3-1.7. In examples, the thickness of the thickest (scratch resistant) layer is sometimes listed as a range. The coating is designed to be optically robust to changes in the thickness of the thickest layer, which can be adjusted to optimize trade-offs between various parameters such as cost, coating time, and hardness or scratch resistance.

Examples 1-5 set forth embodiments of a durable and scratch-resistant optical coating, as described herein, disposed on a substrate. In Examples 1-5 the optical coating included $AlO_xN_y$ and $SiO_2$ layers as shown in Tables 4-8.

Examples 1-3

To determine the refractive index dispersion curves for the coating materials, layers of each coating material were formed onto silicon wafers by DC, RF or RF superimposed DC reactive sputtering from a silicon, aluminum, silicon and aluminum combined or co-sputtered, or magnesium fluoride target (respectively) at a temperature of about 50° C. using ion assist. The wafer was heated to 200° C. during deposition of some layers and targets having a 3 inch diameter were used. Reactive gases used included nitrogen, fluorine and oxygen; argon was used as the inert gas. The RF power was supplied to the silicon target at 13.56 MHz and DC power was supplied to the Si target, Al target and other targets.

The refractive indices (as a function of wavelength) of each of the formed layers and the glass substrate were measured using spectroscopic ellipsometry. The refractive indices thus measured were then used to calculate reflectance spectra for Examples 1-5. The examples use a single refractive index value in their descriptive tables for convenience, which corresponds to a point selected from the dispersion curves at about 550 nm wavelength.

TABLE 4

Optical film attributes for Example 1

| Coating/Layer | Periods, if applicable | Material | Refractive Index (at 550 nm) | Physical Thickness (nm) |
|---|---|---|---|---|
| Ambient medium | — | Air | 1 | |
| Optical coating | 1 | $SiO_2$ | 1.48114 | 75 |
| | | $AlO_xN_y$ | 2.00605 | 27 |
| | | $SiO_2$ | 1.48114 | 16 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | Substrate | | |
| Total coating thickness (nm) | | | | 2239.7 |

TABLE 5

Optical film attributes for Example 2

| Coating/Layer | Periods, if applicable | Material | Refractive Index (at 550 nm) | Physical Thickness (nm) |
|---|---|---|---|---|
| Ambient medium | — | Air | 1 | |
| Optical coating | 1 | $SiO_2$ | 1.48114 | 100 |
| | | $AlO_xN_y$ | 2.00605 | 34 |
| | | $SiO_2$ | 1.48114 | 15 |
| Scratch-Resistant Layer | | $AlO_xN_y$ | 2.00605 | 2000 (may be in range from 100-5000 nm) |
| | 1 | $SiO_2$ | 1.48114 | 8.78 |
| | | $AlO_xN_y$ | 2.00605 | 44.19 |
| | 2 | $SiO_2$ | 1.48114 | 32.41 |
| | | $AlO_xN_y$ | 2.00605 | 24.3 |
| | 3 | $SiO_2$ | 1.48114 | 58.55 |
| | | $AlO_xN_y$ | 2.00605 | 7.47 |
| — | — | Substrate | | |
| Total coating thickness (nm) | | | | 2324.7 |

TABLE 6

Optical film attributes for Example 3

| Coating/Layer | Periods, if applicable | Material | Refractive Index (at 550 nm) | Physical Thickness (nm) |
|---|---|---|---|---|
| Ambient medium | — | Air | 1 | |
| Optical coating | 1 | $SiO_2$ | 1.48114 | 105.0 |
| | | $AlO_xN_y$ | 2.00605 | 32.0 |
| | | $SiO_2$ | 1.48114 | 16.0 |
| Scratch-Resistant Layer | | $AlO_xN_y$ | 2.00605 | 2000.0 (may be in range from 100-5000 nm) |
| | 1 | $SiO_2$ | 1.48114 | 8.6 |
| | | $AlO_xN_y$ | 2.00605 | 44.1 |
| | 2 | $SiO_2$ | 1.48114 | 29.4 |
| | | $AlO_xN_y$ | 2.00605 | 26.0 |
| | 3 | $SiO_2$ | 1.48114 | 50.2 |
| | | $AlO_xN_y$ | 2.00605 | 8.6 |
| — | — | Substrate | | |
| Total coating thickness (nm) | | | | 2319.9 |

Figure 14:
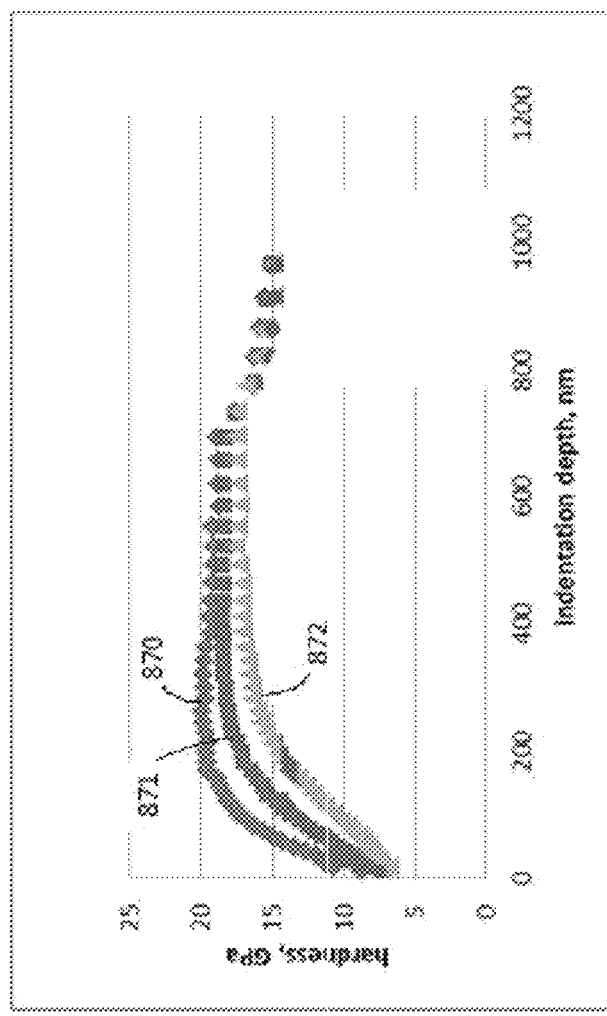
FIG. 14 depicts hardness of one or more coated articles described herein.

FIG. 14 shows nanohardness measurements for the optical coatings of Table 6, 872 corresponds to the optical coating of Table 6. As seen from FIG. 14, desirably, hardness quickly increases within the first 100 nm from the surface (up to a value of about 17 to 20 GPa), and is maintained at about the same value (about 17 to 20 GPa) as depth increases from 100 nm to about 700 nm or about 800 nm, as measured from the surface. Such a hardness profile is desirable in reducing damage from scratches, both more severe scratch events responsible for more visible scratches, and less severe scratch events that might otherwise affect the surface characteristics of the optical coatings.

Modeled Example 4

Figure 15:
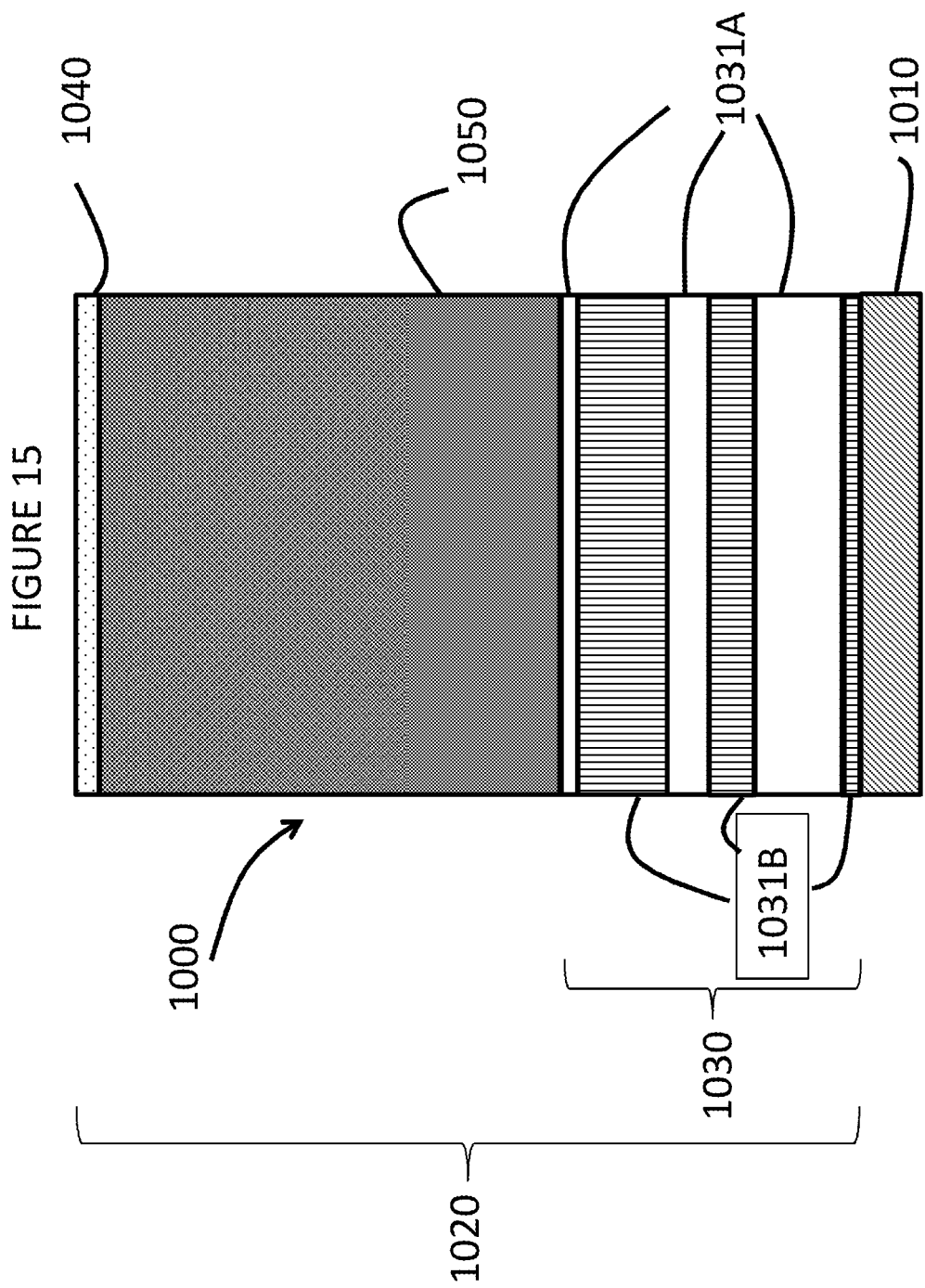
FIG. 15 is a schematic representation of the article according to modeled Example 4.

Modeled Example 4 included an article 1000 with a substrate 1010 and an optical coating 1020 disposed on the substrate. The optical coating 1020 included appearance-enhancing coating 1030, a scratch resistant layer 1050 disposed on the appearance-enhancing coating 1030, and a capping layer 1040 disposed on the scratch-resistant layer 1050. The appearance-enhancing coating 1030 included three sets of sub-layers 1031A, 1031B, between the substrate and the scratch-resistant layer, as shown in FIG. 15. The optical coating materials and thicknesses of each layer, in the order arranged in the optical coating, are provided in Table 7.

TABLE 7

Optical film attributes for Modeled Example 4

| | Layer | Material | Modeled Thickness |
|---|---|---|---|
| | Ambient medium | Air | Immersed |
| | Capping layer | $SiO_2$ | 10 nm |
| | Scratch-resistant layer | AlOxNy | 2000 nm |
| Appearance-enhancing coating | 1st low RI sub-layer | $SiO_2$ | 10 nm |
| | 2nd high RI sub-layer | AlOxNy | 50 nm |
| | 1st low RI sub-layer | $SiO_2$ | 25 nm |
| | 2nd high RI sub-layer | AlOxNy | 25 nm |
| | 1st low RI sub-layer | $SiO_2$ | 50 nm |
| | 2nd high sub-layer | AlOxNy | 10 nm |
| | Substrate | | |

Modeled Example 4 has symmetrical optical interference layer between the substrate and thick scratch resistant layer. In one or more embodiments, the appearance-enhancing coating may be modified to have different sub-layers and sub-layers with different thicknesses so long as the symmetry is preserved.

The physical and/or optical thicknesses of the layers of the optical coating 120 can be adjusted to achieve desired optical and mechanical properties (e.g., hardness). For example, the scratch-resistant layer 150 may be can be made thinner, for example in the range from about 100 nm to about 500 nm, while still providing some resistance to scratch, abrasion, or damage events (including drop events of the article onto hard surfaces such as asphalt, cement, or sandpaper).

The physical thicknesses of the layers or sub-layers of the optical coating 120 may vary by less than about 10 nm, less than about 5 nm, less than about 1 nm or less than about 0.5 nm (representing the range of six standard deviations from the target value) to achieve the maximum targeted repeatability (e.g., a* and b* variations no greater than +/−0.2 for reflected F2 illumination). In some embodiments, larger variations in physical thicknesses of the layers can be tolerated while still achieving the desired targets of the invention for some applications (e.g., a* and b* variations no greater than +/−2.0 for reflected F2 illumination).

Modeled Example 5

Modeled Example 5 included an article having the same structure as shown in FIG. 16. Modeled Example 5 included a substrate 110 and an optical coating 120 disposed on the substrate 110. The optical coating 120 included an appearance-enhancing coating 130 with three sets of sub-layers, a scratch-resistant layer 150 disposed on the appearance-enhancing coating 130 and a capping layer 131 disposed on the scratch-resistant layer 150. The optical coating materials and thicknesses of each layer, in the order arranged in the optical coating, are provided in Table 8.

TABLE 8

Optical film attributes for Modeled Example 5

| | Layer | Material | Modeled Physical Thickness |
|---|---|---|---|
| | Ambient medium | Air | Immersed |
| | Capping layer | RS-$SiO_2$ | 9.5 nm |
| | Scratch-resistant layer | $Si_uAl_vO_xN_y$ | 2000 nm |
| Appearance-enhancing coating | 1st low RI sub-layer | RS-$SiO_2$ | 8.22 nm |
| | 2nd high RI sub-layer | $Si_uAl_vO_xN_y$ | 46.39 nm |
| | 1st low RI sub-layer | RS-$SiO_2$ | 29 nm |
| | 2nd high RI sub-layer | $Si_uAl_vO_xN_y$ | 27.87 nm |
| | 1st low RI sub-layer | RS-$SiO_2$ | 49.63 nm |
| | 2nd high RI sub-layer | $Si_uAl_vO_xN_y$ | 9.34 nm |
| | Substrate | | |

It is believed that Examples 1-2 and Modeled Examples 4 and 5 would also exhibit the hardness values described herein, as measured by the Berkovich Indenter Hardness Test (and, in particular, for example, maximum hardness of one of: (i) about 8 GPa or more; (ii) about 10 GPa or more; (iii) about 12 GPa or more; (iv) about 14 GPa or more; or (v) about 16 GPa or more; and about 50 MPa or less).

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Directional terms as used herein—for example up, down, right, left, front, back, top, bottom—are made only with reference to the figures as drawn and are not intended to imply absolute orientation.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

It will be apparent to those skilled in the art that various modifications and variations can be made without departing from the spirit or scope of the invention. For example, the various features described above may be combined according to the following embodiments.

Embodiment 1

An article comprising:
a glass-ceramic substrate having a major surface;
an optical coating disposed on the major surface and forming an appearance-enhancing surface, the optical coating comprising an appearance-enhancing coating, and a scratch-resistant layer, wherein
the article comprises a hardness of 8 GPa or more, and
the article exhibits a photopic average diffuse light reflectance measured at the appearance-enhancing surface of one of: (i) about 0.3% or less; (ii) about 0.2% or less; (iii) about 0.1% or less, over an optical wavelength regime in the range from about 400 nm to about 800 nm.

Embodiment 2

An article comprising:
a glass-ceramic substrate having a major surface;
an optical coating disposed on the major surface and forming an appearance-enhancing surface, the optical coating comprising an appearance-enhancing coating, and a scratch-resistant layer, wherein
the article comprises a hardness of 8 GPa or more,
in the ($L^*$, $a^*$, $b^*$) colorimetry system of the International Commission on Illumination, at near-normal incidence, the article comprises a diffuse reflectance $dE^*$ of one of: (i) about 3 or less; (ii) about 2 or less; or (iii) about 1 or less, where $dE^*$ is defined as $dE^*=sqrt(L^{*2}+a^{*2}+b^{*2})$.

Embodiment 3

The article of Embodiment 2, the article exhibits a photopic average diffuse light reflectance measured at the appearance-enhancing surface of one of: (i) about 0.3% or less; (ii) about 0.2% or less; (iii) about 0.1% or less, over an optical wavelength regime in the range from about 400 nm to about 800 nm.

Embodiment 4

The article of any of the preceding Embodiments, the appearance-enhancing surface of the article comprises a photopic average total reflectance of one of: (i) less than about 4%; (ii) less than about 3%; (iii) less than about 2%; (iv) less than about 1.5%.

Embodiment 5

The article of any of the preceding Embodiments, the appearance-enhancing surface comprises at least one of a total, a specular, and a diffuse reflected color, at near-normal incidence within a range of 0 to −8 in both $a^*$ and $b^*$.

Embodiment 6

The article of any of the preceding Embodiments, at least one of total reflected color and specular reflected color having at least one of: (i) $b^*<0$; (ii) $b^*$ from 0 to −10; and (iii) $a^*$ from 0 to −2.

Embodiment 7

The article of any of the preceding Embodiments, the diffuse reflected color is at least one of: (i) $b^*$ less than zero; (ii) $b^*$ from 0 to −2; (iii) $b^*$ from 0 to −1; and (iv) $a^*$ from −0.5 to 0.5.

Embodiment 8

The article of any of the preceding Embodiments, wherein in the ($L^*$, $a^*$, $b^*$) colorimetry system of the International Commission on Illumination, the color coordinate shift is less than 4 in ($a^*$, $b^*$) color space when comparing the near-normal incidence color of the article to the color measured at an angle, or at all angles, between 20 and 60 degrees, where the color shift is defined as $dC^*=sqrt((a_t^*-a^*)^2+(b_t^*-b^*)^2)$ and $a_t^*$ and $b_t^*$ are the target colors coordinates and $a^*$ and $b^*$ are the color coordinates of the article.

Embodiment 9

The article of any of the preceding Embodiments, wherein in the ($L^*$, $a^*$, $b^*$) colorimetry system of the International Commission on Illumination, at near-normal incidence, the article comprises a $dC^*$ of one of: (i) 1 or less; or (ii) 0.5 or less, wherein $dC^*=sqrt(a^{*2}+b^{*2})$.

Embodiment 10

The article of any of the preceding Embodiments, the ceramic portion of the glass-ceramic comprises one of: (i) less than about 20%; or (ii) less than about 10%, crystalline material.

Embodiment 11

The article of any of the preceding Embodiments, the ceramic component of the glass-ceramic comprises $Fe_2O_3$, $TiO_2$, or $MgO$ crystallites Embodiment 12

The article of 11, the crystallites comprising an average size from about 5 nm to about 50 nm, the crystallites comprising a cross-sectional area fraction of less than about 15% of the overall cross-sectional area of the glass-ceramic substrate.

Embodiment 13

The article of any of the preceding Embodiments, the article exhibits a photopic average total light transmittance of one of: (i) about 10% or less; (ii) about 5% or less; (iii) about 1% or less; or (iv) about 0.1% or less, over an optical wavelength regime in the range from about 400 nm to about 800 nm

Embodiment 14

The article of any of the preceding Embodiments, the article exhibiting a maximum hardness of one of: (i) about 10 GPa or more; (ii) about 12 GPa or more; (iii) about 14 GPa or more; or (iv) about 16 GPa or more, as measured on the appearance-enhancing surface by a Berkovich Indenter Hardness Test along an indentation depth of about 100 nm.

Embodiment 15

The article of any of the preceding Embodiments, wherein the article exhibits a hardness of about 10 GPa or greater at an indentation depth of about 100 nm and a hardness of about 16 GPa or greater at an indentation depth of about 500 nm as measured on the appearance-enhancing surface by a Berkovich Indenter Hardness Test.

Embodiment 16

The article of any one of the preceding Embodiments, wherein the article exhibits an abrasion resistance after a 500-cycle abrasion using a Taber Test on the appearance-enhancing surface, wherein after abrasion the appearance-enhancing surface exhibits an average roughness Ra, as measured by atomic force microscopy, of about 12 nm or less.

Embodiment 17

The article of any one of the preceding Embodiments, wherein the appearance-enhancing coating comprises a plurality of layers, wherein the plurality of layers comprises a first low RI layer, a second high RI layer, and an optional third layer, and further wherein the appearance-enhancing coating comprises a plurality of periods such that the first low RI layer and the second high RI layer alternate.

Embodiment 18

The article of any one of the preceding Embodiments, wherein the appearance-enhancing coating comprises a first portion and a second portion, and a scratch resistant layer disposed between the first portion and the second portion.

Embodiment 19

The article of any one of the preceding Embodiments, wherein the appearance-enhancing coating comprises a thickness and a plurality of layers comprising a nitride or oxy-nitride material, and where the combined thickness of the layers comprising a nitride or an oxyinitride is about 50% or greater of the thickness of the appearance-enhancing coating.

Embodiment 20

The article of any one of the preceding Embodiments, comprising a scratch resistant layer, the scratch resistant layer comprising a high RI layer, and comprising the thickest layer in the appearance-enhancing coating.

Embodiment 21

The article of any one of the preceding Embodiments, the scratch resistant layer having a thickness in the range from about 0.5 micrometer to about 3 micrometers.

Embodiment 22

The article of any one of the preceding Embodiments, wherein at least one of (i) the layers positioned over the scratch resistant layer comprise a total thickness of less than or equal to about 200 nm; and (ii) each of the layers other than the scratch resistant layer comprises an optical thickness (n*d) in the range from about 2 nm to about 200 nm.

Embodiment 23

The article of any one of the preceding Embodiments, wherein the scratch resistant layer comprises a high RI material, one or more of the layers positioned over the scratch resistant layer comprises a high RI material, and one or more of the layers positioned over the scratch resistant layer comprises a low RI material.

Embodiment 24

The article of any of the preceding Embodiments, wherein the uppermost 500 nm of the optical coating measured from the appearance-enhancing surface comprises at least one of:
  less than about 30% of low RI material; and
  at least about 70% of high RI material.

Embodiment 25

A device comprising:
  a housing having front, back, and side surfaces;
  electrical components that are at least partially inside the housing;
  a display at or adjacent to the front surface of the housing; and
  a cover substrate disposed over the display, wherein at least a portion of the housing comprises the article of any one of the preceding Embodiments.

Embodiment 26

An article comprising:
  a glass-ceramic substrate having a major surface; and
  an optical coating disposed on the major surface and forming an appearance-enhancing surface, the optical coating comprising an appearance-enhancing coating,
  the article comprises a hardness of 8 GPa or more,
  the article exhibits a total photopic average reflectance measured at the appearance-enhancing surface of one of: (i) about 75% or more; or (ii) about 80% or more, over an optical wavelength regime in the range from about 400 nm to about 800 nm.

Embodiment 27

The article of any of Embodiment 26, further comprising a specular reflectance of one of: (i) about 2% or more; (ii) about 4% or more; (iii) about 5% or more; (iv) about 6% or more; (v) about 7% or more; (vi) about 8% or more; (vii) about 9% or more; (viii) about 10% or more.

Embodiment 28

The article of Embodiment 26 or Embodiment 27, wherein in the (L*, a*, b*) colorimetry system of the International Commission on Illumination, the total reflectance comprises reflected color coordinates a* and b* that are each one of: (i) less than 0; or (ii) from 0 to −4, for all viewing angles from 0 to 60 degrees.

Embodiment 29

The article of any one of Embodiments 26-28 wherein in the (L*, a*, b*) colorimetry system of the International Commission on Illumination, the diffuse and/or total reflected color comprises one of: (i) b* less than 0; (ii) b* from −0.5 to −2; and (iii) a* from 0 to −2.

Embodiment 30

The article of any one of Embodiments 26-29, wherein the total photopic average transmittance is one of: (i) about 10% or less; (ii) about 8% or less; (iii) about 6% or less; (iv) about 5% or less; (v) about 4% or less; (vi) about 3% or less; (vii) about 2% or less.

Embodiment 31

The article of any one of Embodiments 26-30, the article exhibiting a maximum hardness of one of: (i) about 10 GPa or more; (ii) about 12 GPa or more; (iii) about 14 GPa or more; or (iv) about 16 GPa or more, as measured on the appearance-enhancing surface by a Berkovich Indenter Hardness Test along an indentation depth of about 100 nm.

Embodiment 32

The article of any of one of Embodiments 26-31, wherein the article exhibits a hardness of about 10 GPa or greater at an indentation depth of about 100 nm and a hardness of about 16 GPa or greater at an indentation depth of about 500 nm as measured on the appearance-enhancing surface by a Berkovich Indenter Hardness Test.

Embodiment 33

The article of any one of Embodiments 26-32, wherein the article exhibits an abrasion resistance after a 500-cycle abrasion using a Taber Test on the appearance-enhancing surface, wherein after abrasion the appearance-enhancing surface exhibits an average roughness Ra, as measured by atomic force microscopy, of about 12 nm or less.

Embodiment 34

The article of any one of Embodiments 26-33, wherein the appearance-enhancing coating comprises a plurality of layers, wherein the plurality of layers comprises a first low RI layer, a second high RI layer, and an optional third layer, and further wherein the appearance-enhancing coating comprises a plurality of periods such that the first low RI layer and the second high RI layer alternate.

Embodiment 35

The article of any one of Embodiments 26-34, wherein the appearance-enhancing coating comprises a first portion and a second portion, and a scratch resistant layer disposed between the first portion and the second portion.

Embodiment 36

The article of any one of Embodiments 26-35, wherein the optical coating comprises a thickness and a plurality of layers comprising a nitride or oxy-nitride material, and where the combined thickness of the layers comprising a nitride or an oxyinitride is about 50% or greater of the thickness of the optical coating.

Embodiment 37

The article of any one of Embodiments 26-36, comprising a scratch resistant layer, the scratch resistant layer comprising a high RI layer, and comprising the thickest layer in the appearance-enhancing coating.

Embodiment 38

The article of Embodiments 37, the scratch resistant layer having a thickness in the range from about 0.5 micrometer to about 3 micrometers.

Embodiment 39

The article of any one of Embodiments 37-38, wherein at least one of: (i) the layers positioned over the scratch resistant layer comprise a total thickness of less than or equal to about 200 nm; and (ii) each of the layers other than the scratch resistant layer comprises an optical thickness (n*d) in the range from about 2 nm to about 200 nm.

Embodiment 40

The article of any one of Embodiments 37-39, wherein the scratch resistant layer comprises a high RI material, one or more of the layers positioned over the scratch resistant layer comprises a high RI material, and one or more of the layers positioned over the scratch resistant layer comprises a low RI material.

Embodiment 41

The article of any one of Embodiments 26-40, wherein the uppermost 500 nm of the optical coating measured from the appearance-enhancing surface comprises at least one of:
less than about 30% of low RI material; and
at least about 70% of high RI material.

Embodiment 42

A device comprising:
a housing having front, back, and side surfaces;
electrical components that are at least partially inside the housing;
a display at or adjacent to the front surface of the housing; and
a cover substrate disposed over the display, wherein at least a portion of the housing comprises the article of any one of Embodiments 26-41.

Embodiment 43

An article comprising:
a glass-ceramic substrate having a major surface; and
an optical coating disposed on the major surface and forming an appearance-enhancing surface, the optical coating comprising an appearance-enhancing coating,
the article comprises a hardness of 8 GPa or more,
the article exhibits a total photopic average transmittance measured at the appearance-enhancing surface of one of: (i) from about 20% to about 85%; or (ii) from about 60% to about 85%, over an optical wavelength regime in the range from about 400 nm to about 800 nm.

Embodiment 44

The article of any of Embodiment 43, further comprising a diffuse specular transmittance that is about 90% or more of the total transmittance.

Embodiment 45

The article of any one of Embodiments 43-44, the article further comprising a specular photopic average transmittance that is one of: (i) about 10% or less; (ii) about 8% or less; (iii) about 6% or less; (iv) about 5% or less; (v) about 4% or less; (vi) about 3% or less; (vii) about 2% or less; or (viii) about 1% or less.

Embodiment 46

The article of any one of Embodiments 43-45, the article further comprising a total photopic average reflectance that is one of: (i) from about 5% to about 50%; and (ii) from about 15% to about 30%.

Embodiment 47

The article of any one of Embodiments 43-46, the article further comprising a specular photopic average reflectance that is one of: (i) about 12% or less; (ii) about 10% or less; (iii) about 8% or less; (iv) about 6% or less; (v) about 5% or less; or less; and (vi) about 4% or less.

Embodiment 48

The article of any one of Embodiments 43-47, wherein in the ($L^*$, $a^*$, $b^*$) colorimetry system of the International Commission on Illumination, the diffuse and/or total reflected color coordinates $a^*$ and $b^*$ are at least one of (i) $b^*<0$; (ii) $b^*$ from $-10$ to $-50$; and (iii) $a^*$ from $-5$ to $5$.

Embodiment 49

The article of any one of Embodiments 43-48 wherein in the ($L^*$, $a^*$, $b^*$) colorimetry system of the International Commission on Illumination, the diffuse and/or total transmitted color comprises one of (i) $b^*$ greater than 0; (ii) $b^*$ from 0 to 20; and (iii) $a^*$ from $-2$ to $2$.

Embodiment 50

The article of any one of Embodiments 43-49, the article exhibiting a maximum hardness of one of: (i) about 10 GPa or more; (ii) about 12 GPa or more; (iii) about 14 GPa or more; or (iv) about 16 GPa or more, as measured on the appearance-enhancing surface by a Berkovich Indenter Hardness Test along an indentation depth of about 100 nm.

Embodiment 51

The article of any of one of Embodiments 43-50, wherein the article exhibits a hardness of about 10 GPa or greater at an indentation depth of about 100 nm and a hardness of about 16 GPa or greater at an indentation depth of about 500 nm as measured on the appearance-enhancing surface by a Berkovich Indenter Hardness Test.

Embodiment 52

The article of any one of Embodiments 43-51, wherein the article exhibits an abrasion resistance after a 500-cycle abrasion using a Taber Test on the appearance-enhancing surface, wherein after abrasion the appearance-enhancing surface exhibits an average roughness Ra, as measured by atomic force microscopy, of about 12 nm or less.

Embodiment 53

The article of any one of Embodiments 43-52, wherein the appearance-enhancing coating comprises a plurality of layers, wherein the plurality of layers comprises a first low RI layer, a second high RI layer, and an optional third layer, and further wherein the appearance-enhancing coating comprises a plurality of periods such that the first low RI layer and the second high RI layer alternate.

Embodiment 54

The article of any one of Embodiments 43-53, wherein the appearance-enhancing coating comprises a first portion and a second portion, and a scratch resistant layer disposed between the first portion and the second portion.

Embodiment 55

The article of any one of Embodiments 43-54, wherein the optical coating comprises a thickness and a plurality of layers comprising a nitride or oxy-nitride material, and where the combined thickness of the layers comprising a nitride or an oxyinitride is about 50% or greater of the thickness of the optical coating.

Embodiment 56

The article of any one of Embodiments 43-55, comprising a scratch resistant layer, the scratch resistant layer comprising a high RI layer, and comprising the thickest layer in the appearance-enhancing coating.

Embodiment 57

The article of Embodiments 56, the scratch resistant layer having a thickness in the range from about 0.5 micrometer to about 3 micrometers Embodiment 58

The article of any one of Embodiments 56-57, wherein at least one of (i) the layers positioned over the scratch resistant layer comprise a total thickness of less than or equal to about 200 nm; and (ii) each of the layers other than the scratch resistant layer comprises an optical thickness ($n*d$) in the range from about 2 nm to about 200 nm.

Embodiment 59

The article of any one of Embodiments 56-58, wherein the scratch resistant layer comprises a high RI material, one or more of the layers positioned over the scratch resistant layer comprises a high RI material, and one or more of the layers positioned over the scratch resistant layer comprises a low RI material.

Embodiment 60

The article of any one of Embodiments 43-59, wherein the uppermost 500 nm of the optical coating measured from the appearance-enhancing surface comprises at least one of:
less than about 30% of low RI material; and
at least about 70% of high RI material.

Embodiment 61

A device comprising:
a housing having front, back, and side surfaces;
electrical components that are at least partially inside the housing;
a display at or adjacent to the front surface of the housing; and
a cover substrate disposed over the display, wherein at least a portion of the housing comprises the article of any one of Embodiments 43-60.

What is claimed is:

1. An article comprising:
a glass-ceramic substrate having a major surface, wherein the substrate further comprises a black color; and
an optical coating disposed on the major surface and forming an appearance-enhancing surface, the optical coating comprising an appearance-enhancing coating, and a scratch-resistant layer, wherein the scratch-resistant layer comprises a thickness from about 0.5 µm to about 3 µm, wherein
the article comprises a hardness of 8 GPa or more,
the article exhibits a photopic average diffuse light reflectance measured at the appearance-enhancing surface of about 0.3% or less over an optical wavelength regime in the range from about 400 nm to about 800 nm,
wherein the appearance-enhancing coating comprises a plurality of layers that comprise a first low refractive index (RI) layer and a second high RI layer, and further wherein the appearance-enhancing coating comprises a plurality of periods such that the first low RI layer and the second high RI layer alternate,
wherein the appearance-enhancing coating comprises a first portion and a second portion, the scratch-resistant layer disposed between the first portion and the second portion,
wherein the plurality of layers comprises a nitride or an oxynitride material, and
further wherein the first portion of the appearance-enhancing coating is disposed over the scratch-resistant layer and comprises a total thickness of less than or equal to about 200 nm.

2. The article of claim 1, the appearance-enhancing surface of the article comprises a photopic average total reflectance of less than about 4%.

3. The article of claim 1, the appearance-enhancing surface comprises at least one of a total, a specular, and a diffuse reflected color, at near-normal incidence within a range of 0 to −8 in both a* and b*.

4. The article of claim 1, at least one of total reflected color and specular reflected color having at least one of: (i) b*<0; (ii) b* from 0 to −10; and (iii) a* from 0 to −2.

5. The article of claim 1, the diffuse reflected color is at least one of: (i) b* less than zero; (ii) b* from 0 to −2; (iii) b* from 0 to −1; and (iv) a* from −0.5 to 0.5.

6. The article of claim 1, the ceramic component of the glass-ceramic comprises $Fe_2O_3$, $TiO_2$, or $MgO$ crystallites, the crystallites comprising an average size from about 5 nm to about 50 nm, the crystallites comprising a cross-sectional area fraction of less than about 15% of the overall cross-sectional area of the glass-ceramic substrate.

7. The article of claim 1, the article exhibits a photopic average total light transmittance of about 10% or less over an optical wavelength regime in the range from about 400 nm to about 800 nm.

8. The article of claim 1, wherein the article exhibits a hardness of about 10 GPa or greater at an indentation depth of about 100 nm and a hardness of about 16 GPa or greater at an indentation depth of about 500 nm as measured on the appearance-enhancing surface by a Berkovich Indenter Hardness Test.

9. The article of claim 1, wherein the article exhibits an abrasion resistance after a 500-cycle abrasion using a Taber Test on the appearance-enhancing surface, wherein after abrasion the appearance-enhancing surface exhibits an average roughness Ra, as measured by atomic force microscopy, of about 12 nm or less.

10. The article of claim 1, wherein the appearance-enhancing coating comprises a thickness and a plurality of layers comprising a nitride or oxy-nitride material, and where the combined thickness of the layers comprising a nitride or an oxyinitride is about 50% or greater of the thickness of the appearance-enhancing coating.

11. The article of claim 1, comprising a scratch resistant layer, the scratch resistant layer comprising a high RI layer, and comprising the thickest layer in the appearance-enhancing coating.

12. The article of claim 1, wherein at least one of (i) the layers positioned over the scratch resistant layer comprise a total thickness of less than or equal to about 200 nm; and (ii) each of the layers other than the scratch resistant layer comprises an optical thickness (n*d) in the range from about 2 nm to about 200 nm.

13. The article of claim 1, wherein the scratch resistant layer comprises a high RI material, one or more of the layers positioned over the scratch resistant layer comprises a high RI material, and one or more of the layers positioned over the scratch resistant layer comprises a low RI material.

14. The article of claim 1, wherein the uppermost 500 nm of the optical coating measured from the appearance-enhancing surface comprises at least one of:
less than about 30% of low RI material; and
at least about 70% of high RI material.

15. A device comprising:
a housing having front, back, and side surfaces;
electrical components that are at least partially inside the housing;
a display at or adjacent to the front surface of the housing; and
a cover substrate disposed over the display, wherein at least a portion of the housing comprises the article of claim 1.

16. The article of claim 1, wherein the first low RI layer comprises $SiO_2$, the second high RI layer comprises $AlO_xN_y$, and the scratch-resistant layer comprises $AlO_xN_y$, wherein the plurality of periods of the appearance-enhancing coating is four periods, wherein the first and second portion of the appearance-enhancing coating comprises one period and three periods, respectively, and further wherein the optical coating comprises a capping layer over the first portion of the appearance-enhancing coating, the capping layer comprising $SiO_2$.

17. An article comprising:
a glass-ceramic substrate having a major surface, wherein the substrate further comprises a black color; and an optical coating disposed on the major surface and forming an appearance-enhancing surface, the optical coating comprising an appearance-enhancing coating, and a scratch-resistant layer, wherein the scratch-resistant layer comprises a thickness from about 0.5 μm to about 3 μm, wherein the article comprises a hardness of 8 GPa or more, the article exhibits a photopic average diffuse light reflectance measured at the appearance-enhancing surface of about 0.3% or less, over an optical wavelength regime in the range from about 400 nm to about 800 nm, in the (L*, a*, b*) colorimetry system of the International Commission on Illumination, at near-normal incidence, the article comprises a diffuse reflectance dE* of about 3 or less, where dE* is defined as dE*=sqrt(L*$^2$+a*$^2$+b*$^2$), wherein the appearance-enhancing coating comprises a plurality of layers that comprise a first low refractive index (RI) layer and a second high RI layer, and further wherein the appearance-enhancing coating comprises a plurality of periods such that the first low RI layer and the second high RI layer alternate, wherein the appearance-enhancing coating comprises a first portion and a second portion, the scratch-resistant layer disposed between the first portion and the second portion, wherein the plurality of layers comprises a nitride or an oxynitride material, and further wherein the first portion of the appearance-enhancing coating is disposed over the scratch-resistant layer and comprises a total thickness of less than or equal to about 200 nm.

18. The article of claim 17, wherein the first low RI layer comprises $SiO_2$, the second high RI layer comprises $AlO_xN_y$, and the scratch-resistant layer comprises $AlO_xN_y$, wherein the plurality of periods of the appearance-enhancing coating is four periods, wherein the first and second portion of the appearance-enhancing coating comprises one period and three periods, respectively, and further wherein the optical coating comprises a capping layer over the first portion of the appearance-enhancing coating, the capping layer comprising $SiO_2$.

* * * * *